United States Patent
Ding

(10) Patent No.: US 7,052,947 B2
(45) Date of Patent: May 30, 2006

(54) FABRICATION OF GATE DIELECTRIC IN NONVOLATILE MEMORIES IN WHICH A MEMORY CELL HAS MULTIPLE FLOATING GATES

(75) Inventor: Yi Ding, Sunnyvale, CA (US)

(73) Assignee: ProMOS Technologies Inc., Hsin Chu (JP)

( * ) Notice: Subject to any disclaimer, the term of this patent is extended or adjusted under 35 U.S.C. 154(b) by 0 days.

(21) Appl. No.: 10/632,154

(22) Filed: Jul. 30, 2003

(65) Prior Publication Data

US 2005/0026366 A1    Feb. 3, 2005

(51) Int. Cl.
*H01L 21/8238* (2006.01)

(52) U.S. Cl. .................. 438/211; 438/257; 438/585

(58) Field of Classification Search .............. 438/211, 438/257, 585
See application file for complete search history.

(56) References Cited

U.S. PATENT DOCUMENTS

| | | | |
|---|---|---|---|
| 4,701,776 A | 10/1987 | Perlegos et al. ............ 357/23.5 |
| 5,402,371 A | 3/1995 | Ono | |
| 5,408,115 A | 4/1995 | Chang ........................ 257/324 |
| 5,424,979 A | 6/1995 | Morii ........................ 365/185 |
| 5,445,983 A | 8/1995 | Hong ........................... 437/43 |
| RE35,094 E * | 11/1995 | Wu et al. .................... 438/264 |
| 5,633,185 A | 5/1997 | Yiu et al. .................... 438/258 |
| 5,668,757 A | 9/1997 | Jeng ........................ 365/185.1 |
| 5,705,415 A | 1/1998 | Orlowski et al. ............. 437/43 |
| 5,821,143 A | 10/1998 | Kim et al. .................. 438/267 |
| 5,856,943 A | 1/1999 | Jeng | |
| 5,901,084 A | 5/1999 | Ohnakado | |
| 5,910,912 A | 6/1999 | Hsu et al. .............. 365/185.01 |
| 5,912,843 A | 6/1999 | Jeng ....................... 365/185.14 |
| 5,918,124 A | 6/1999 | Sung ........................... 438/258 |
| 6,011,725 A | 1/2000 | Eitan ..................... 365/185.33 |
| 6,040,216 A | 3/2000 | Sung ........................... 438/257 |
| 6,057,575 A | 5/2000 | Jenq | |
| 6,107,141 A | 8/2000 | Hsu et al. .................... 438/267 |
| 6,130,129 A | 10/2000 | Chen | |
| 6,133,098 A | 10/2000 | Ogura et al. ................ 438/267 |
| 6,134,144 A | 10/2000 | Lin et al. | |
| 6,162,682 A * | 12/2000 | Kleine ........................ 438/257 |
| 6,171,909 B1 | 1/2001 | Ding et al. | |

(Continued)

FOREIGN PATENT DOCUMENTS

EP        0 938 098 A2    8/1999

OTHER PUBLICATIONS

U.S. Appl. No. 10/798,475, entitled "Fabrication of Conductive Lines Interconnecting Conductive Gates in Nonvolatile Memories and Non-Volatile Memory Structures," filed Mar. 10, 2004.

(Continued)

*Primary Examiner*—Matthew Smith
*Assistant Examiner*—Khiem Nguyen
(74) *Attorney, Agent, or Firm*—Michael Shenker; MacPherson Kwok Chen & Heid LLP

(57) ABSTRACT

In fabrication of a nonvolatile memory cell having two floating gates, one or more peripheral transistor gates are formed from the same layer (140) as the select gate. The gate dielectric (130) for these peripheral transistors and the gate dielectric (130) for the select gates are formed simultaneously. In a nonvolatile memory having a memory cell with two floating gates, the gate dielectric (130) for the peripheral transistors and the gate dielectric (130) for the select gates (140) have the same thickness.

26 Claims, 21 Drawing Sheets

U.S. PATENT DOCUMENTS

| | | | |
|---|---|---|---|
| 6,187,636 B1 | 2/2001 | Jeong | 438/267 |
| 6,200,856 B1 | 3/2001 | Chen | |
| 6,214,669 B1* | 4/2001 | Hisamune | 438/259 |
| 6,218,689 B1* | 4/2001 | Chang et al. | 257/288 |
| 6,228,695 B1 | 5/2001 | Hsieh et al. | 438/201 |
| 6,232,185 B1 | 5/2001 | Wang | 438/266 |
| 6,261,903 B1 | 7/2001 | Chang et al. | |
| 6,265,739 B1* | 7/2001 | Yaegashi et al. | 257/296 |
| 6,266,278 B1 | 7/2001 | Harari et al. | |
| 6,294,297 B1 | 9/2001 | Chen | 430/30 |
| 6,326,661 B1 | 12/2001 | Dormans et al. | |
| 6,344,993 B1 | 2/2002 | Harari et al. | 365/185.01 |
| 6,355,524 B1 | 3/2002 | Tuan et al. | |
| 6,365,457 B1 | 4/2002 | Choi | |
| 6,388,293 B1 | 5/2002 | Ogura et al. | 257/365 |
| 6,414,872 B1 | 7/2002 | Bergemont et al. | |
| 6,420,222 B1* | 7/2002 | Watanabe | 438/201 |
| 6,420,231 B1 | 7/2002 | Harari et al. | |
| 6,436,764 B1 | 8/2002 | Hsieh | 438/257 |
| 6,437,360 B1 | 8/2002 | Cho et al. | |
| 6,438,036 B1 | 8/2002 | Seki et al. | |
| 6,468,865 B1* | 10/2002 | Yang et al. | 438/262 |
| 6,486,023 B1 | 11/2002 | Nagata | |
| 6,518,618 B1 | 2/2003 | Fazio et al. | |
| 6,541,324 B1 | 4/2003 | Wang | |
| 6,541,829 B1 | 4/2003 | Nishinohara et al. | |
| 6,566,196 B1* | 5/2003 | Haselden et al. | 438/257 |
| 6,635,533 B1 | 10/2003 | Chang et al. | 438/259 |
| 6,642,103 B1* | 11/2003 | Wils et al. | 438/257 |
| 6,660,589 B1 | 12/2003 | Park | 438/257 |
| 6,667,511 B1* | 12/2003 | Fang | 257/321 |
| 6,696,340 B1 | 2/2004 | Furuhata | 438/257 |
| 6,747,310 B1* | 6/2004 | Fan et al. | 257/320 |
| 6,764,905 B1 | 7/2004 | Jeng et al. | 438/267 |
| 6,803,276 B1 | 10/2004 | Kim et al. | 438/257 |
| 6,818,504 B1* | 11/2004 | Rabkin et al. | 438/257 |
| 6,844,586 B1 | 1/2005 | Ding | 257/315 |
| 6,846,712 B1 | 1/2005 | Ding | 438/257 |
| 6,902,974 B1* | 6/2005 | Ding | 438/257 |
| 6,908,817 B1* | 6/2005 | Yuan | 438/264 |
| 2002/0042180 A1* | 4/2002 | Tuan et al. | 438/257 |
| 2002/0064071 A1* | 5/2002 | Takahashi et al. | 365/185.29 |
| 2002/0197888 A1 | 12/2002 | Huang et al. | |
| 2003/0068859 A1* | 4/2003 | Leung et al. | 438/257 |
| 2003/0205776 A1* | 11/2003 | Yaegashi et al. | 257/500 |
| 2003/0218908 A1 | 11/2003 | Park et al. | |
| 2004/0004863 A1 | 1/2004 | Wang | |

OTHER PUBLICATIONS

U.S. Appl. No. 10/797,972, entitled "Fabrication of Conductive Lines Interconnecting First Conductive Gates in Nonvolatile Memories Having Second Conductive Gates Provided By Conductive Gates Lines, Wherein The Adjacent Conductive Gate Lines for The Adjacent Columns Are Spaced From Each Other, And Non-Volatile Memory Structures," filed Mar. 10, 2004.

Van Duuren, Michiel et al., "Compact poly-CMP Embedded Flash Memory Cells For One or Two Bit Storage," Philips Research Leuven, Kapeldreef 75, B3001 Leuven, Belgium, pp. 73-74.

U.S. Appl. No. 10/440,466, entitled "Fabrication Of Conductive Gates For Nonvolatile Memories From Layers With Protuding Portions," filed May 16, 2003.

U.S. Appl. No. 10/440,005, entitled "Fabrication of Dielectric On A Gate Surface To Insulate The Gate From Another Element Of An Integrated Circuit," filed May 16, 2003.

U.S. Appl. No. 10/440,508, entitled "Fabrication Of Gate Dielectric In Nonvolatile Memories Having Select, Floating And Control Gates," filed May 16, 2003.

U.S. Appl. No. 10/440,500, entitled "Integrated Circuits With Openings that Allow Electrical Contact To Conductive Features Having Self-Aligned Edges," filed May 16, 2003.

U.S. Appl. No. 10/393,212, entitled "Nonvolatile Memories And Methods Of Fabrication," filed Mar. 19, 2003.

U.S. Appl. No. 10/411,813, entitled "Nonvolatile Memories With A Floating Gate Having An Upward Protrusion," filed Apr. 10, 2003.

U.S. Appl. No. 10/393,202, entitled "Fabrication of Integrated Circuit Elements In Structures With Protruding Features," filed Mar. 9, 2003.

U.S. Appl. No. 10/631,941, entitled "Nonvolatile Memory Cell With Multiple Floating Gates Formed After The Select Gate," filed Jul. 30, 2003.

U.S. Appl. No. 10/632,155, entitled "Nonvolatile Memory Cells With Buried Channel Transistors," filed on Jul. 30, 2003.

U.S. Appl. No. 10/632,007, entitled "Arrays Of Nonvolatile Memory Cells Wherin Each Cell Has Two Conductive Floating Gates," filed Jul. 30, 2003.

U.S. Appl. No. 10/631,452, entitled "Fabrication Of Dielectric For A Nonvolatile Memory Cell Having Multiple Floating Gates," filed Jul. 30, 2003.

U.S. Appl. No. 10/631,552, entitled "Nonvolatile Memories And Methods Of Fabrication," filed Jul. 30, 2003.

U.S. Appl. No. 10/632,186, entitled "Nonvolatile Memory Cell With Multiple Floating Gates Formed After The Select Gate And Having Upward Protrusions," filed on Jul. 30, 2003.

Shirota, Riichiro "A Review of 256Mbit NAND Flash Memories and NAND Flash Future Trend," Feb. 2000, Nonvolatile Memory Workshop in Monterey, CA, pp. 22-31.

Naruke, K.; Yamada, S.; Obi, E.; Taguchi, S.; and Wada, M. "A New Flash-Erase EEPROM Cell with A Sidewall Select-Gate On Its Source Side," 1989 IEEE, pp. 604-606.

Wu, A.T.; Chan T.Y.; Ko, P.K.; and Hu, C. "A Novel High-Speed, 5-Volt Programming EPROM Structure With Source-Side Injection," 1986 IEEE, 584-587.

Mizutani, Yoshihisa; and Makita, Koji "A New EPROM Cell With A Sidewall Floating Gate Fro High-Density and High Performance Device," 1985 IEEE, 635-638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split-Gate Source-Side-Injection Cell for 5V-Only Applications," 1994 Symposium on VLSI Technology Digest of Technical Papers, pp. 49-50.

Mih, Rebecca et al. "0.18um Modular Triple Self-Aligned Embedded Split-Gate Flash Memory," 2000 Symposium on VLSI Technology Digest of Technical Papers, pp. 120-121.

Ma, Yale et al., "A Dual-Bit Split-Gate EEPROM (DSG) Cell in Contactless Array for Single Vcc High Density Flash Memories," 1994 IEEE, 3.5.1-3.5.4.

Spinelli, Alessandro S., "Quantum-Mechanical 2D Simulation of Surface-and Buried-Channel p-MOS," 2000 International Conference on Simulation of Semiconductor Processes and Devices: SISPAD 2000, Seattle, WA Sep. 6-8, 2000.

Kim, K.S. et al. "A Novel Dual String NOR (DuSnor) Memory Cell Technology Scalabe to the 256 Mbit and 1 Gbit Flash Memories," 1995 IEEE 11.1.1-11.1.4.

Bergemont, A. et al. "NOR Virtual Ground (NVG)- A New Scaling Concept for Very High Density FLAS EEPROM and its Implementation in a 0.5 um Process," 1993 IEEE 2.2.1-2.2.4.

Van Duuren, Michiel et al., "Compact poly-CMP Embedded Flash Memory Cells For One or Two Bit Storage," Philips Research Leuven, Kapeldreef 75, B3001 Leuven, Belgium, pp. 73-74.

* cited by examiner

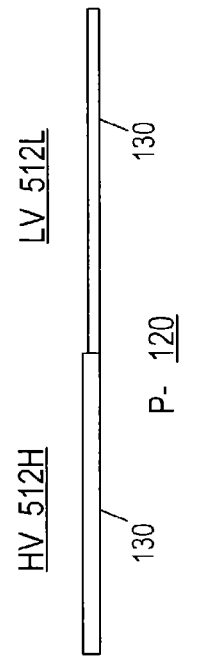
FIG. 12B (PERIPHERY)
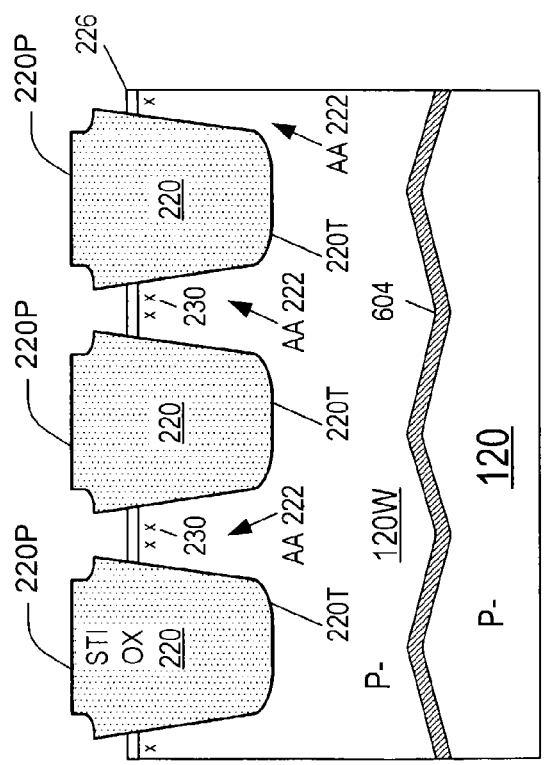
FIG. 11 (Y1-Y1')
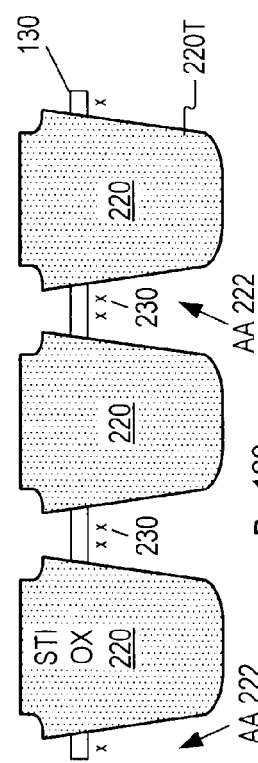
FIG. 12A (Y1-Y1')

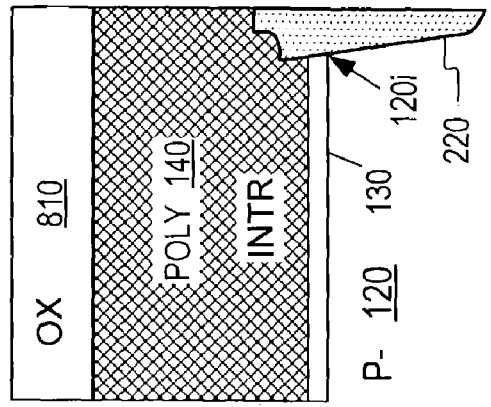
FIG. 13B (PERIPHERY)
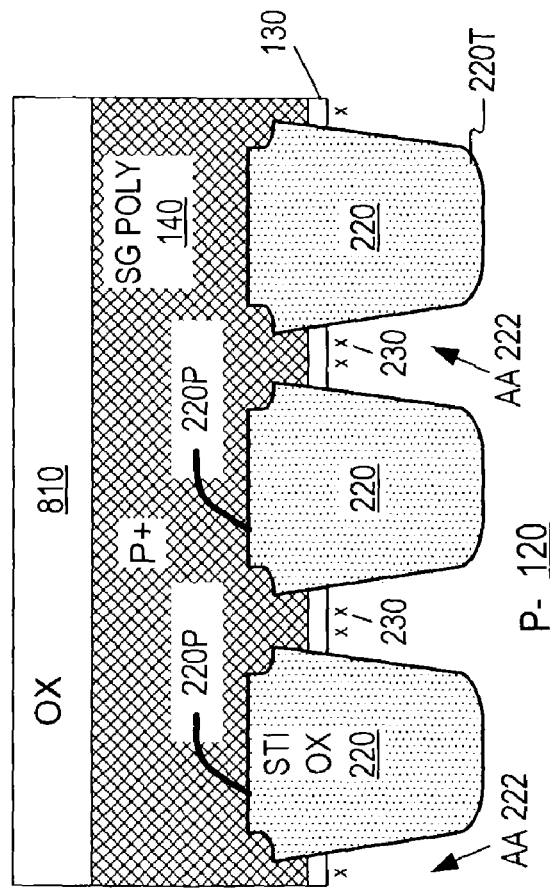
FIG. 13A (Y1-Y1')

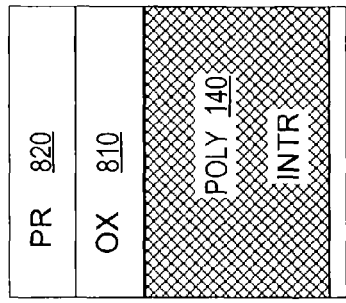
FIG. 14B (PERIPHERY)
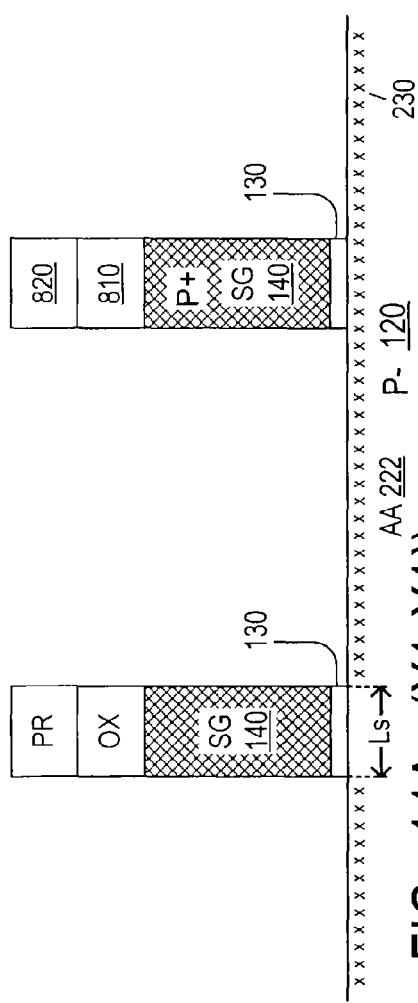
FIG. 14A (X1-X1')
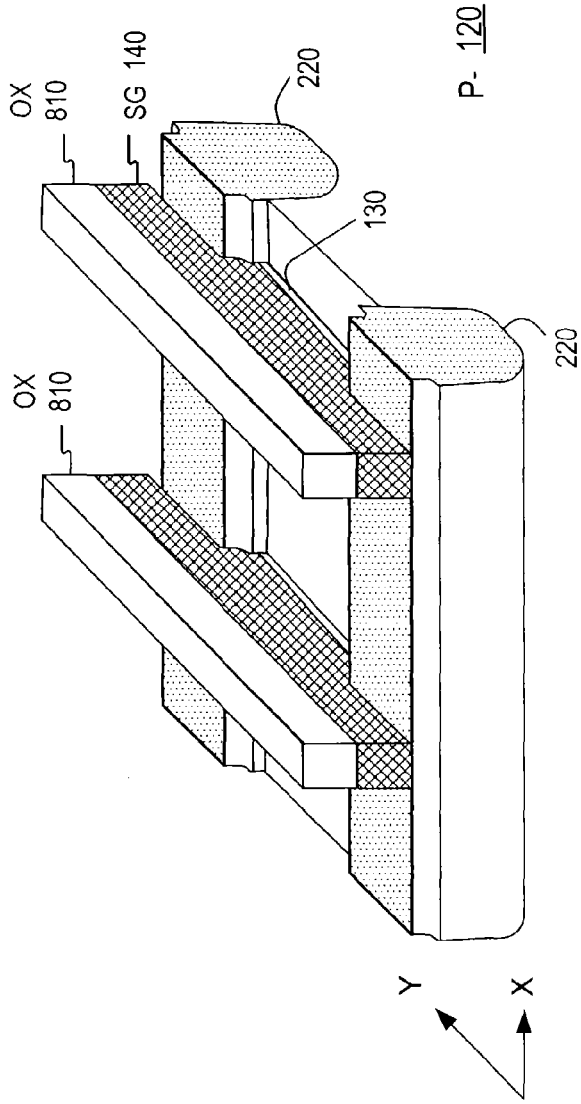
FIG. 15

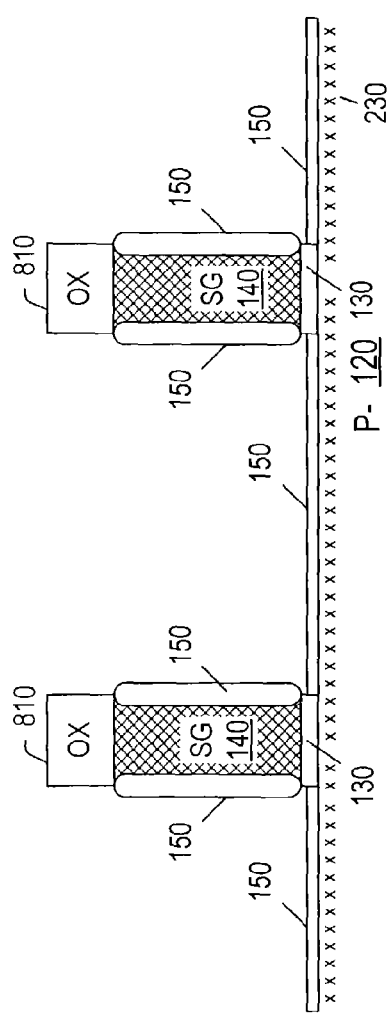
FIG. 16 (X1-X1')
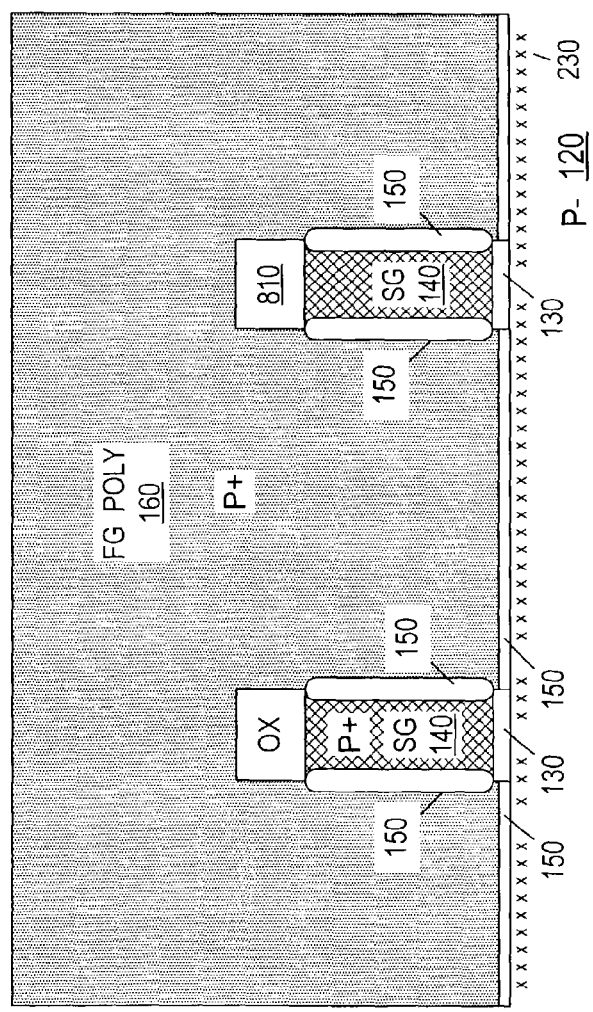
FIG. 17 (X1-X1')

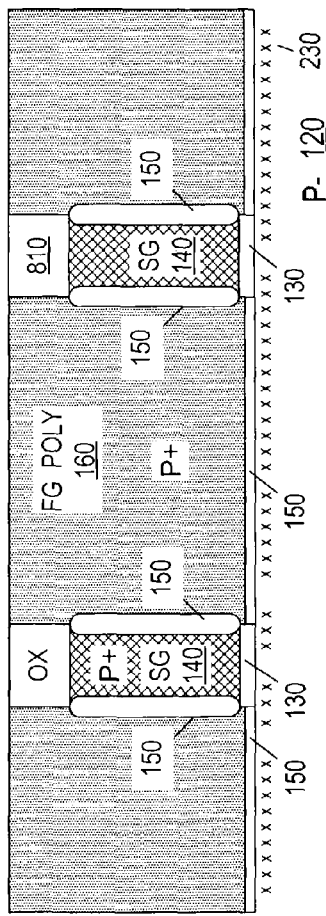
FIG. 18 (X1-X1')
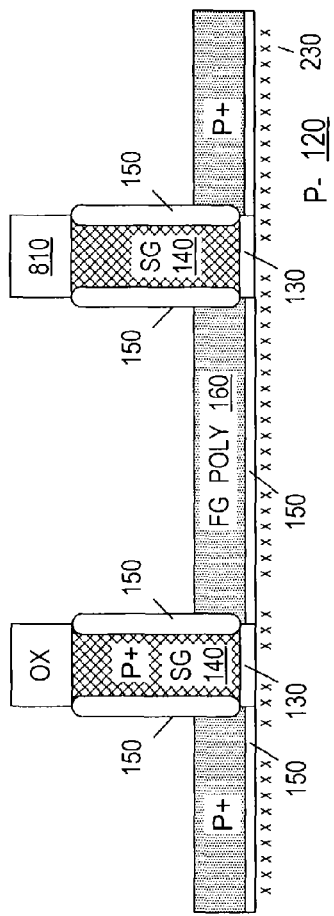
FIG. 19A (X1-X1')
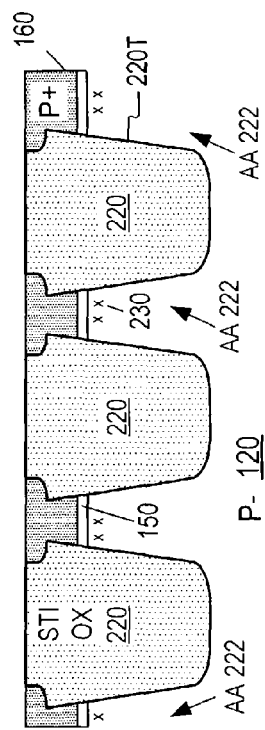
FIG. 19B (Y2-Y2')

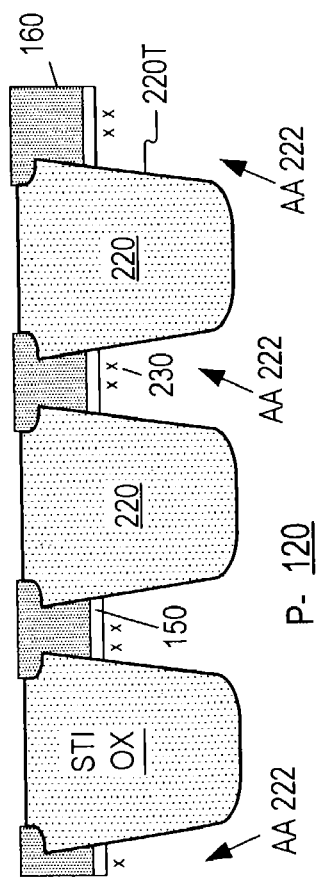
FIG. 20A (Y2-Y2')
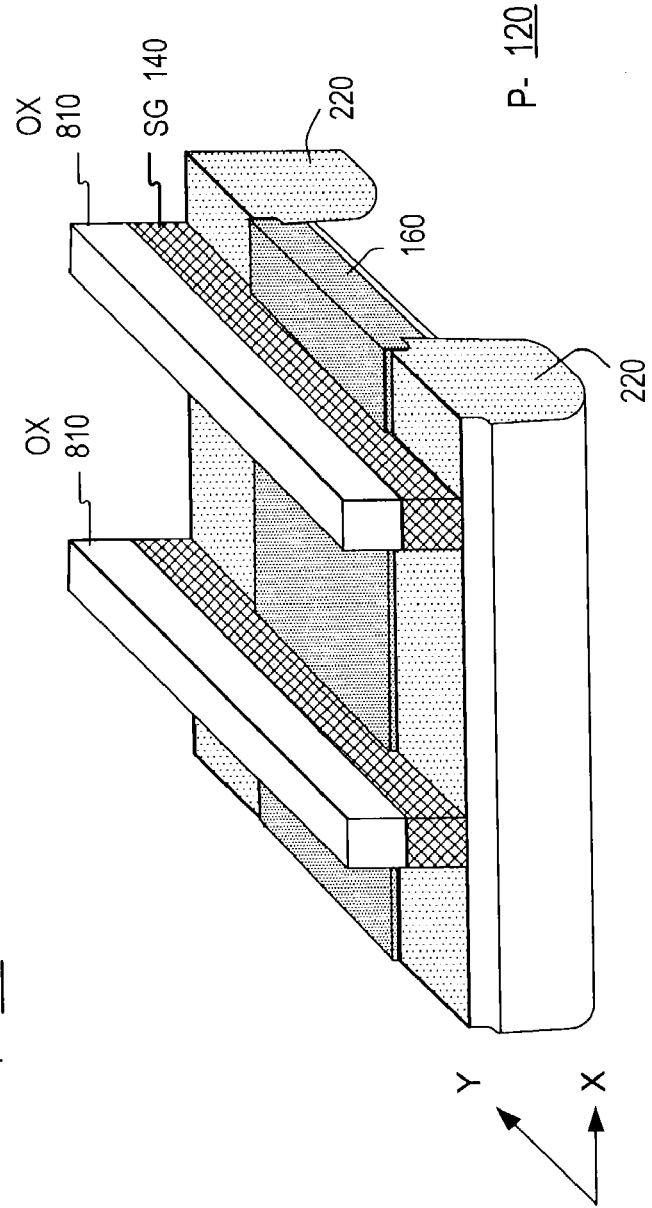
FIG. 20B

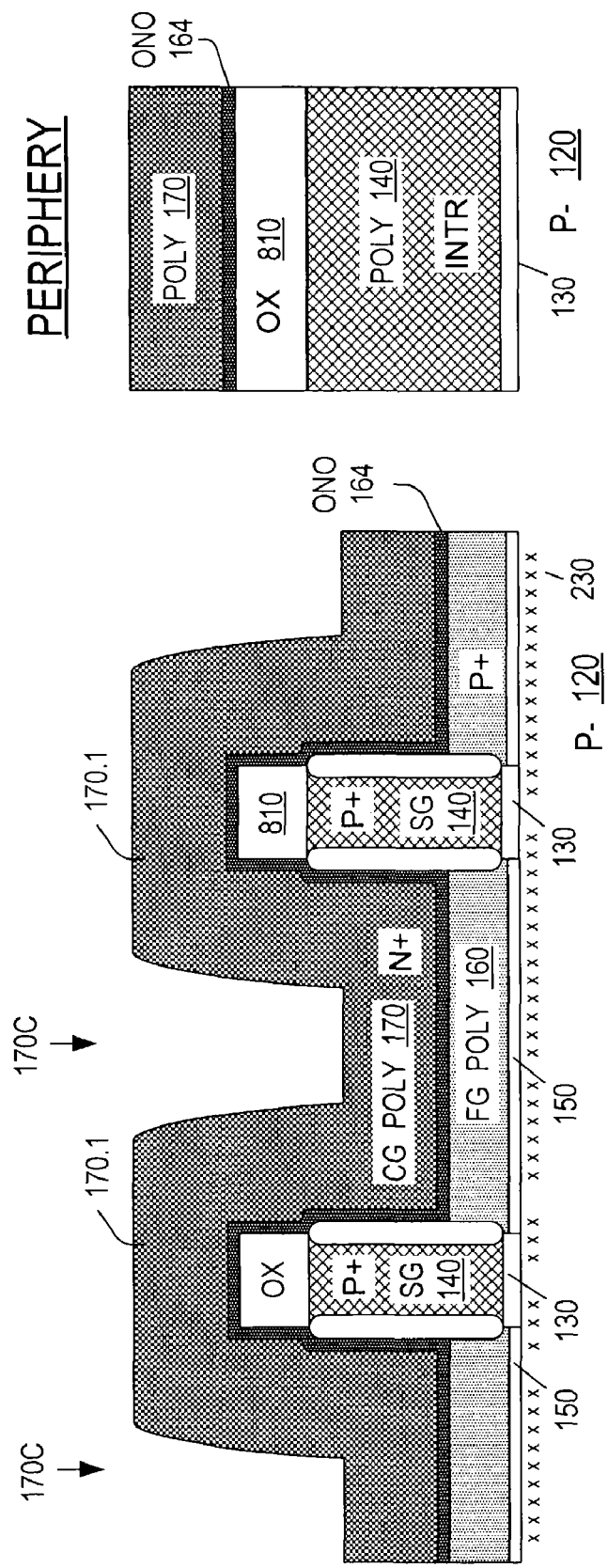

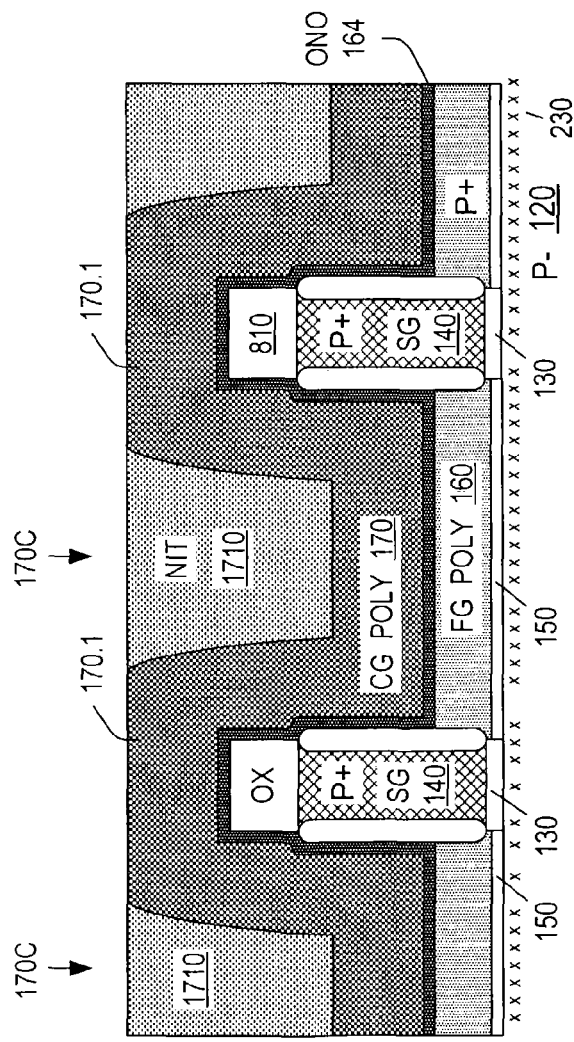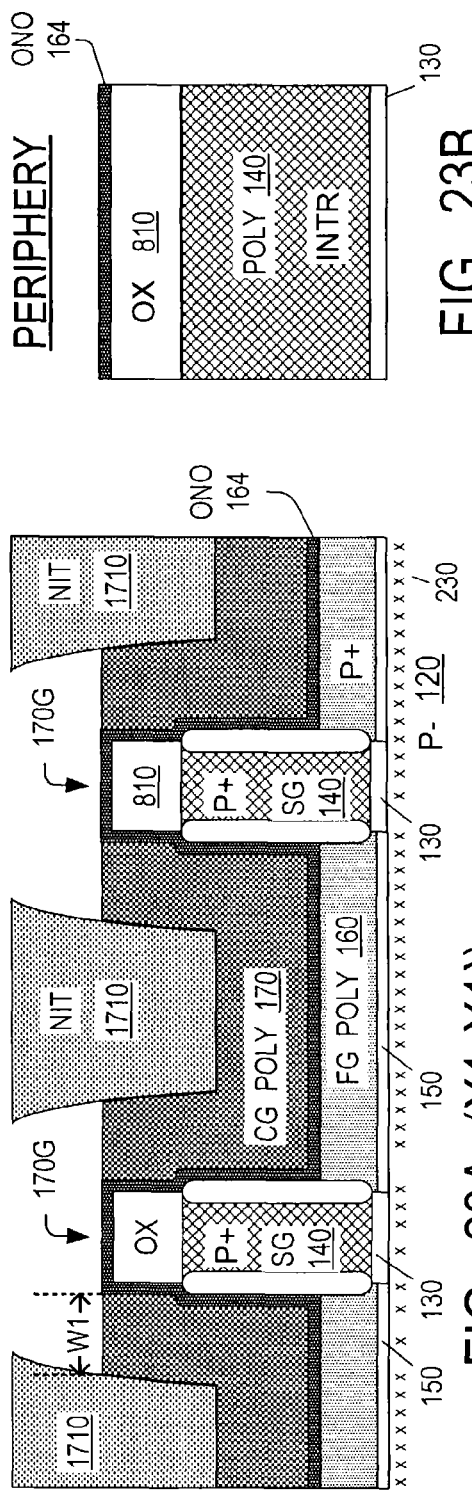

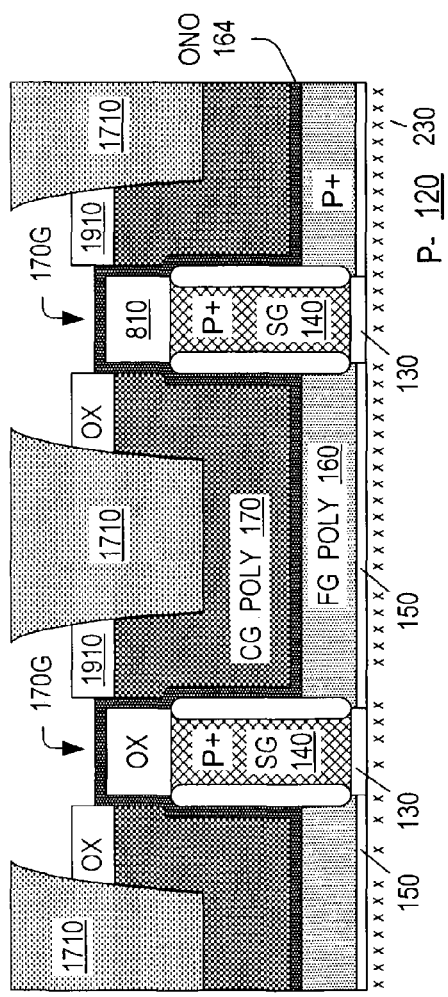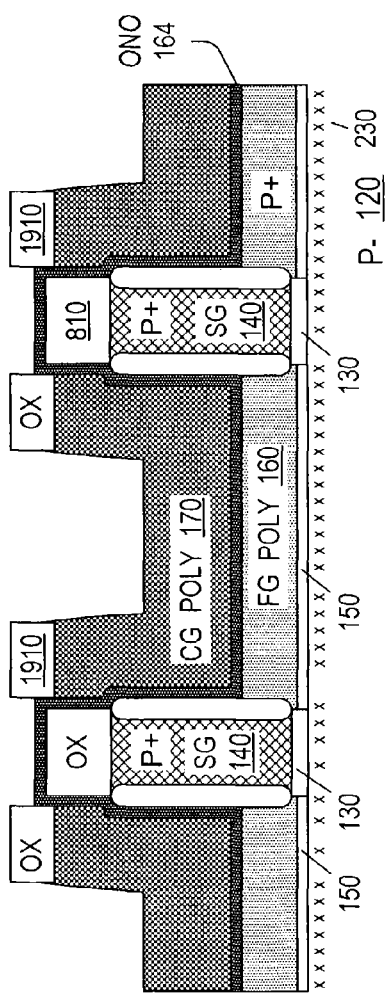

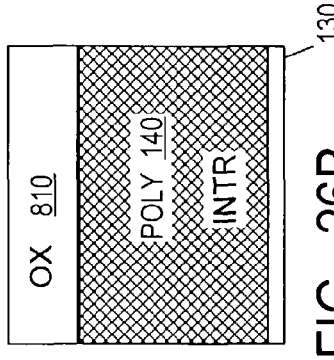
FIG. 26B
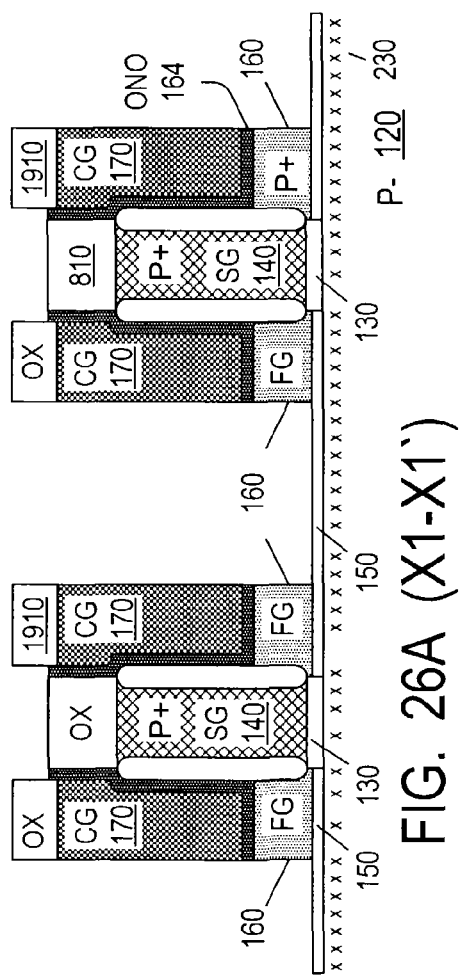
FIG. 26A (X1-X1')
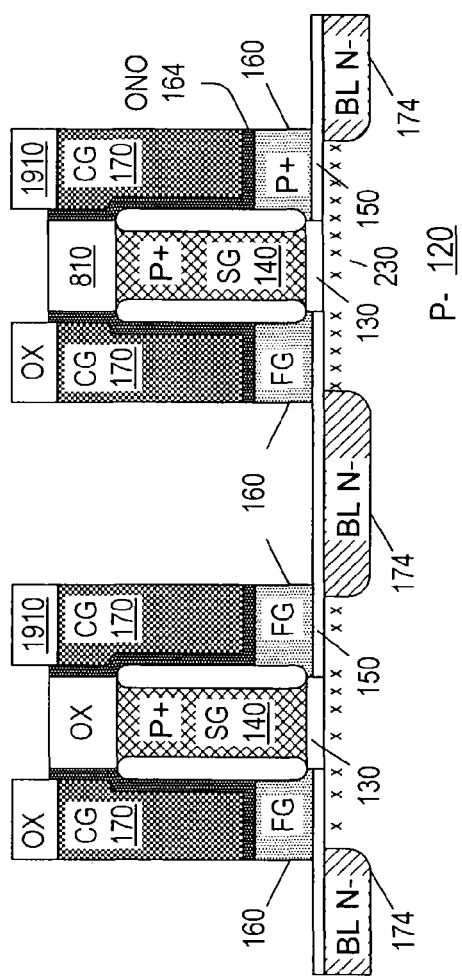
FIG. 27A (X1-X1')

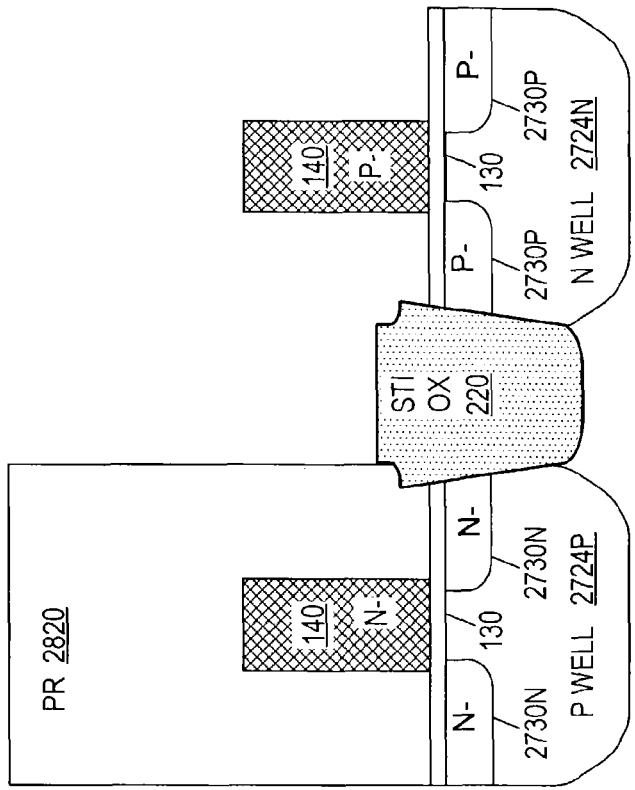
FIG. 28 (PERIPHERY)
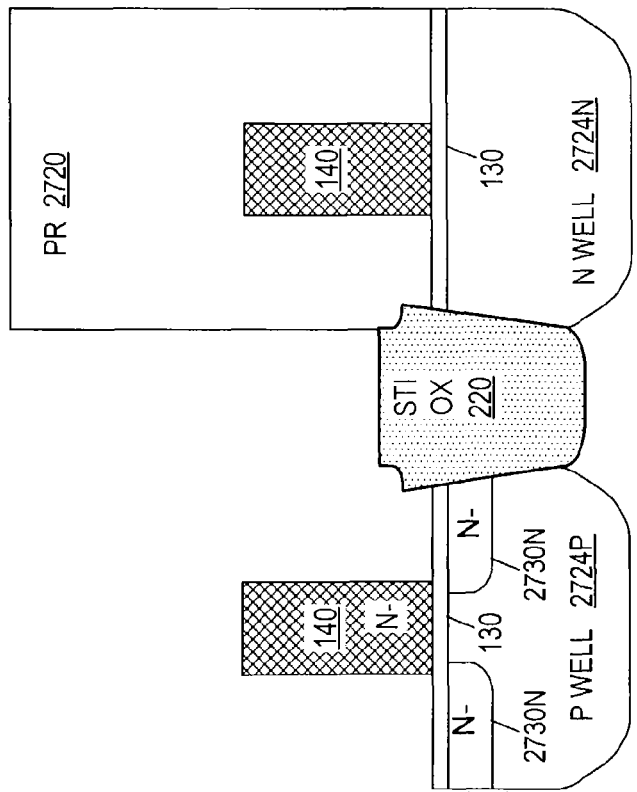
FIG. 27B (PERIPHERY)

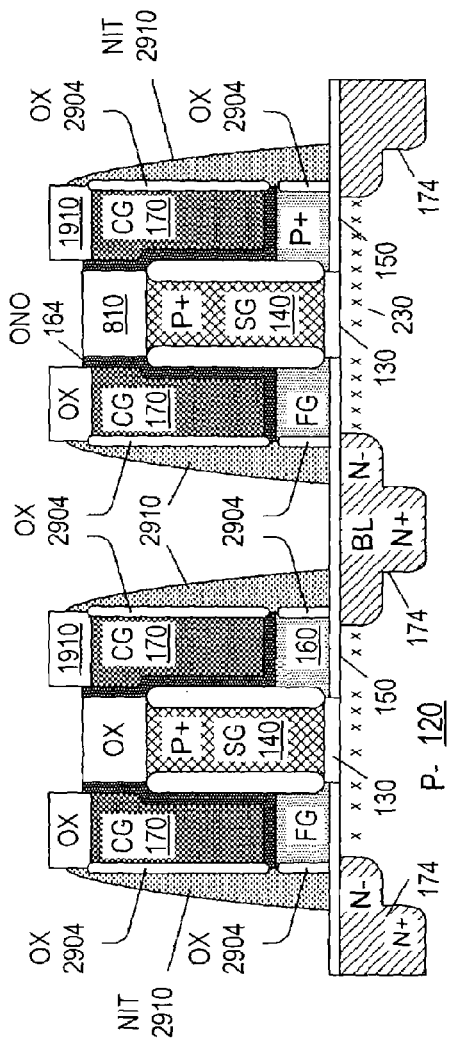
FIG. 29A (X1-X1')
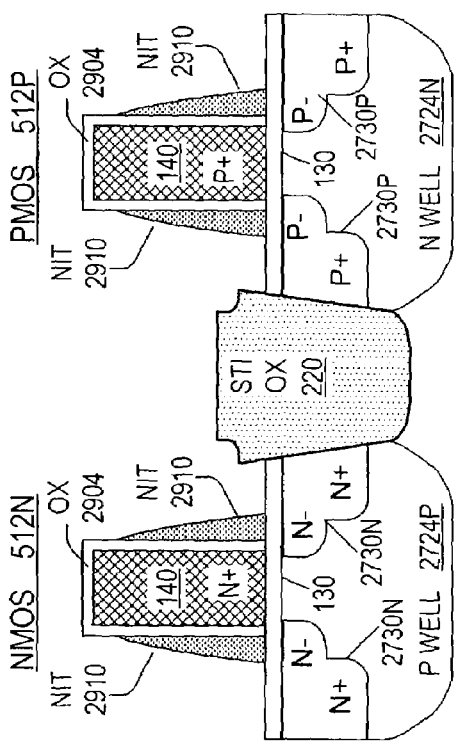
FIG. 29B (PERIPHERY)

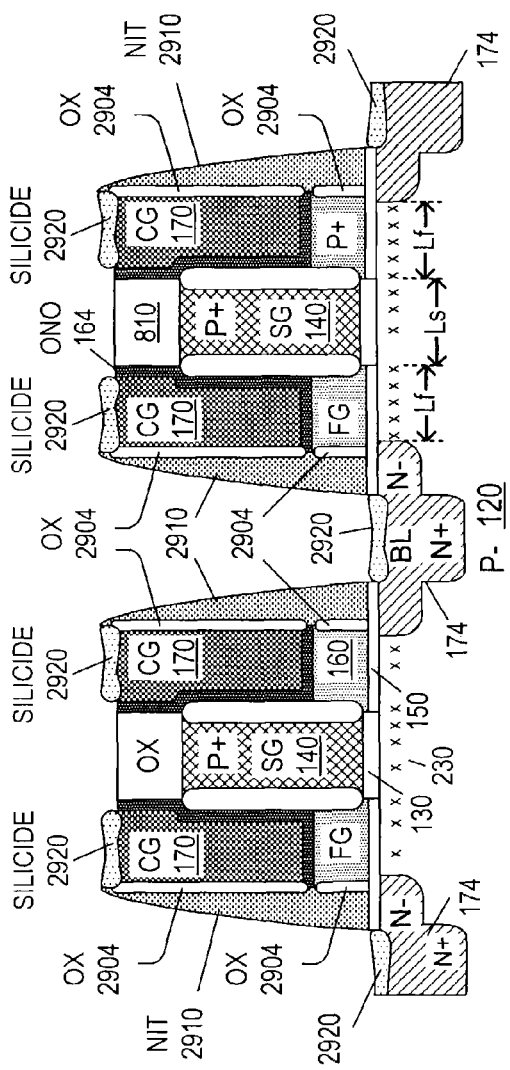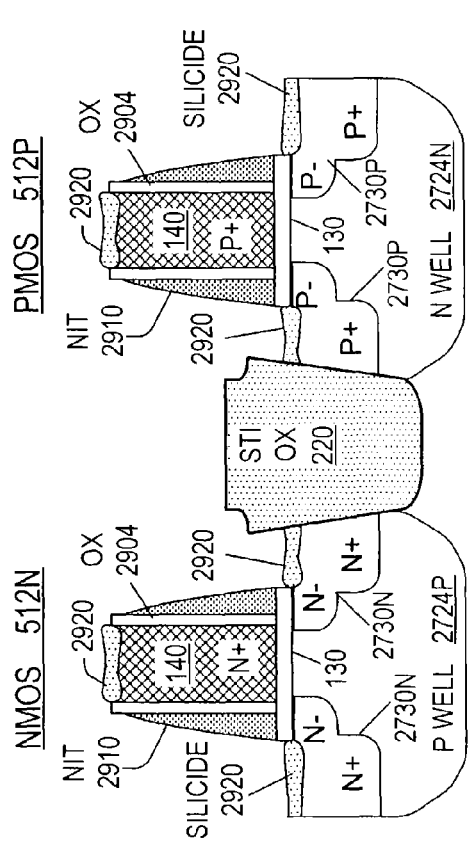

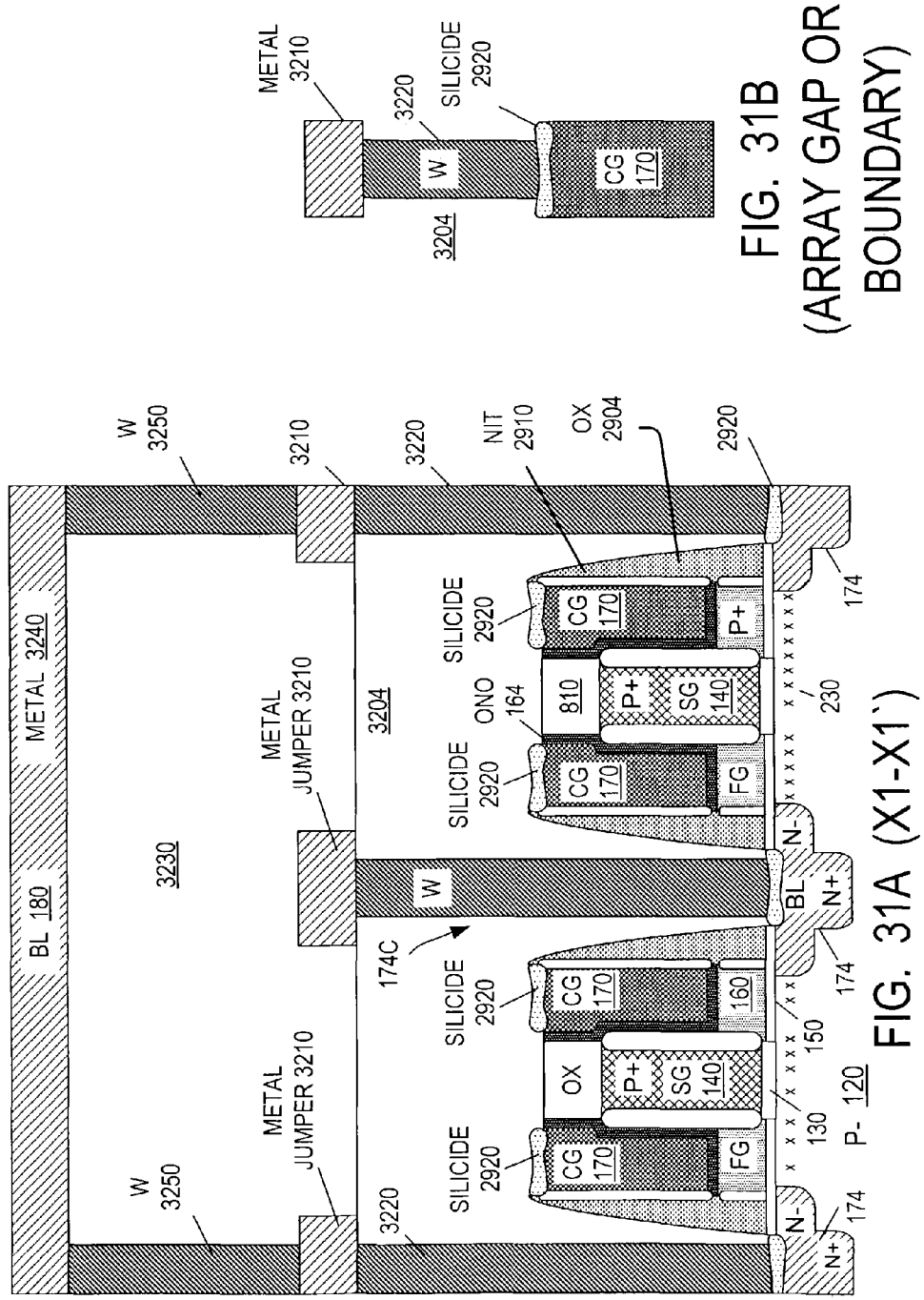
FIG. 31B (ARRAY GAP OR BOUNDARY)
FIG. 31A (X1-X1')

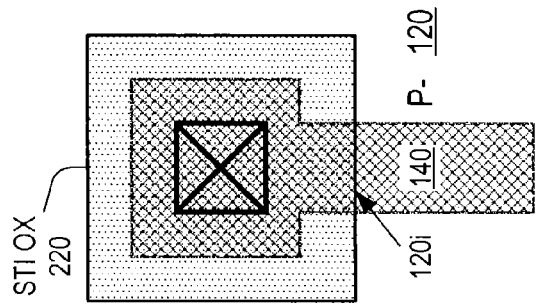
FIG. 31E (PERIPHERY)
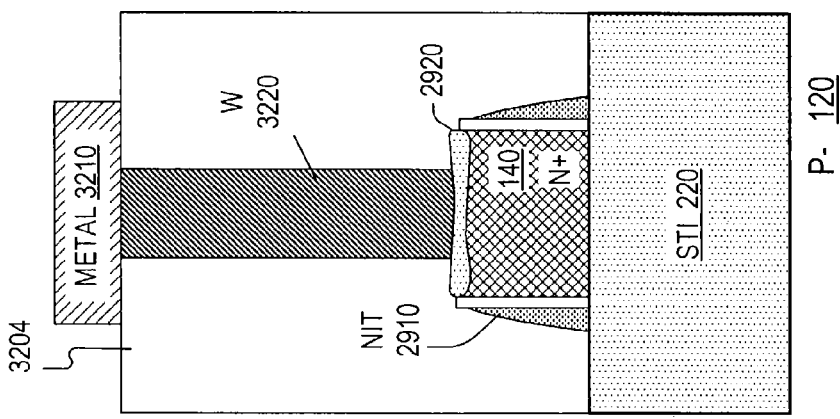
FIG. 31D (PERIPHERY)
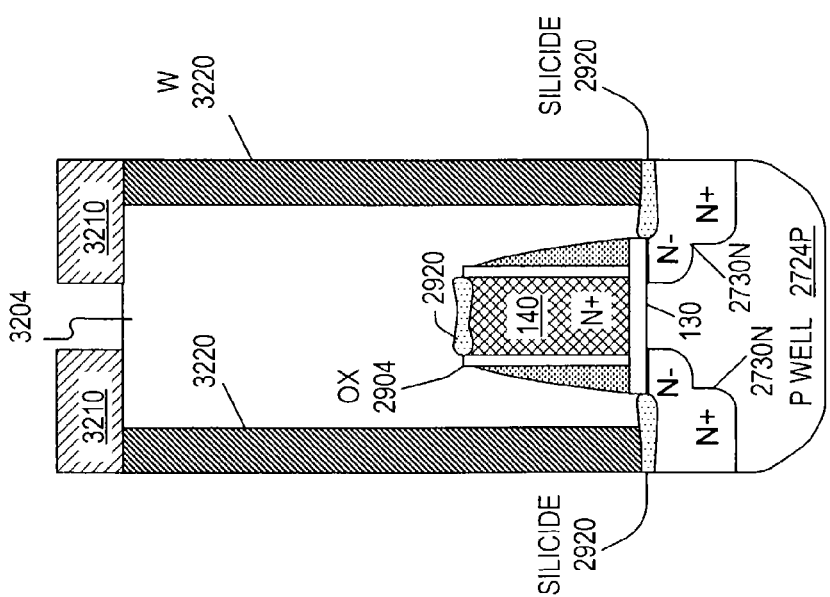
FIG. 31C (PERIPHERY)

FABRICATION OF GATE DIELECTRIC IN NONVOLATILE MEMORIES IN WHICH A MEMORY CELL HAS MULTIPLE FLOATING GATES

BACKGROUND OF THE INVENTION

The present invention relates to nonvolatile memories.

FIGS. 1–4 illustrate a flash memory fabrication process described in van Duuren et al., "Compact poly-CMP embedded flash memory cells for one or two bit storage", Proceedings of NVSMW 2003 (Non-Volatile Semiconductor Memory Workshop), Monterey, Calif., pages 73–74. Tunnel oxide 150, polysilicon floating gate 160, inter-poly dielectric 164, control gate 170, and a nitride cap layer 172 are fabricated in a stacked structure ("FG/CG stack"). TEOS spacers 176 are formed on both sides of the stack. Then oxide 130 is grown for the access gate.

AG (access gate) polysilicon 140 is deposited over the FG/CG stack. See FIG. 2. Polysilicon 140 is polished by chemical mechanical polishing (CMP), as shown in FIG. 3. Then polysilicon 140 is patterned using resist 173 to define the access gate, as shown in FIGS. 3 and 4. Source/drain regions 174 are formed to obtain a one-bit memory cell 102 (FIG. 4).

As noted in the Duuren et al. article, the length of access gate 140 depends on the mask alignment, "which could lead to an odd-even word line effect in arrays".

FIG. 5 shows a two-bit memory cell 110 described in the same article. Two FG/CG stack transistors 110L, 110R share an access gate 140. According to the Duuren et al. article, the cell is fabricated with the same process as cell 102, but cell 110 is fully self-aligned and therefore not sensitive to mask misalignment.

Each bit 110L, 110R can be programmed or erased independently of the other bit. The bit can be programmed by Fowler-Nordheim tunneling (FN) or source side injection (SSI). The Duuren et al. article states that the two bit cell has been studied "with 180 bit arrays in a virtual ground configuration". The read, program (SSI) and erase voltages bit 110R are shown respectively in FIGS. 6, 7 and 8. In the read and program operations (FIGS. 6 and 7), the "pass" voltage for the control gate in bit 110L (6.0 V) is high enough to turn on the corresponding FG/CG transistor regardless of the state of its floating gate.

A typical memory includes peripheral circuitry (not shown) including decoders, sense amplifiers, high voltage generators, and other circuits used for the memory access. It is desirable to provide improved manufacturing techniques for fabricating the memory and the peripheral circuits.

SUMMARY

This section summarizes some features of the invention. Other features are described in the subsequent sections. The invention is defined by the appended claims which are incorporated into this section by reference.

The present invention relates to fabrication of a memory cell having multiple floating gates (such as the cell of FIG. 5, for example). In some embodiments, the access gate is formed before the floating gates. In some embodiments, the memory cell also has control gates (like in FIG. 5), and the access gate is formed before the floating and control gates.

Below the term "select gate" is used instead of "access gate".

In some embodiments of the present invention, one or more peripheral transistor gates are formed from the same layer as the select gate. The gate dielectric for these peripheral transistors and the gate dielectric for the select gates (such as dielectric 130 in FIG. 1) are formed simultaneously. Elimination of separate processing steps to form the gate dielectric for these peripheral transistors advantageously reduces the overall thermal processing involved in the memory fabrication.

In some embodiments, these peripheral transistors are high voltage transistors. High voltage transistors are transistors exposed to super high voltages. "Super high voltages" are voltages of a higher magnitude than the voltages provided to a memory cell in a read operation. For example, suppose the read voltages are all in the range from Vss to Vcc, where Vss is ground, and Vcc is a power supply voltage (received from an external power supply or generated internally) of 3.0V. Then a super high voltage is a voltage of a magnitude above 3.0V. (Super high voltages of −9.0V or −10.0V are used in some embodiments.)

High voltage transistors may need a fairly thick gate dielectric. Select gates may also need a thick dielectric. In some embodiments, the memory is erased through the channel region. In the erase operation, the voltage between the substrate and the select gate is super high, so the select gate dielectric is made thick to sustain this voltage. The select gate dielectric matches the dielectric thickness of the high voltage transistors.

In some embodiments, the select gate dielectric is thicker than the dielectric underlying the floating gates (such as dielectric 150 in FIG. 1). In some embodiments, the memory includes peripheral transistors with different gate dielectric thicknesses, and the select gate dielectric is at least as thick as any peripheral transistor gate dielectric.

Other features and advantages of the invention are described below. The invention is defined by the appended claims.

BRIEF DESCRIPTION OF THE DRAWINGS

FIGS. 11, 12A, 12B, 13A, 13B, 14A, 14B show vertical cross sections of integrated circuit structures according to embodiments of the present invention.

FIG. 15 is a perspective view of an integrated circuit structure according to an embodiment of the present invention.

FIGS. 16, 17, 18, 19A, 19B, 20A, 20B, 21A, 21B, 22, 23A, 23B, 24, 25, 26A, 26B, 27A, 27B, 28, 29A, 29B, 30A, 30B, 31A–31D show vertical cross sections of integrated circuit structures according to embodiments of the present invention.

FIGS. 31E, 32 are top views of integrated circuit structures according to embodiments of the present invention.

DESCRIPTION OF SOME EMBODIMENTS

Figure 3:
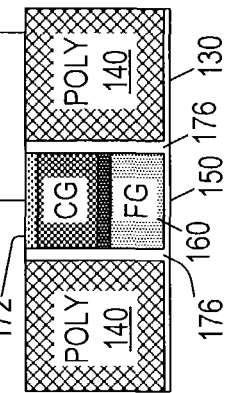
FIGS. 1–8 shows vertical cross sections of prior art memory cells and intermediate structures obtained in prior art fabrication processes.
Figure 2:
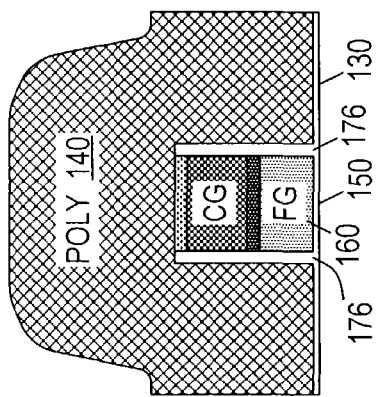

The embodiments described in this section illustrate but do not limit the invention. The invention is not limited to particular materials, process steps, or dimensions. The invention is defined by the appended claims.

One embodiment of the invention will now be described on the example of the memory array of FIG. 9. In this example, the array has 4 rows and 5 columns, but any number of rows and columns can be present. FIG. 10A is a top view of the array. FIG. 10B is a perspective view. Each memory cell 110 may have the same structure is in FIG. 5, but may also have a different structure (see e.g. FIG. 30A). Each cell 110 has two FG/CG stacks per one select gate 140. Conductive select gate lines 140 and conductive control gate lines 170 run through the memory array in the Y direction (row direction). Each row includes one select gate line 140 and two control gate lines 170. The line 140 provides the select gates for that row of cells. One of the lines 170 provides the control gates for the bits 110L in that row, and the other line 170 provides the control gates for the bits 110R. Bitlines 180 (marked BL0–BL5 for rows 0–5) run in the X direction (column direction). The bitlines contact the corresponding source/drain regions 174 ("bitline regions") in areas 174C (FIG. 10A) marked with a cross. Floating gates 160 are marked with dashed crosses in FIG. 10A. The floating gates can be completely self-aligned (i.e. defined independently of photolithographic alignment), as described below.

Substrate isolation trenches 220T run through the array in the X direction. Trenches 220T are filled with dielectric 220 (field isolation). Active areas 222 run through the array between the trenches 220T. Each active area 222 includes active areas of individual cells in one memory column. The active area of each cell consists of the cell's source/drain regions 174 and the P type channel region extending between the regions 174.

In each column, each two consecutive memory cells have their adjacent source/drain regions 174 merged into a single contiguous region (referenced by the same numeral 174). Each such region 174 provides the source/drain regions to only two of the memory cells in each column. In each column 1–4 (each column except the first column and the last column), each source/drain region 174 is connected to a source/drain region 174 of an adjacent column. The connections alternate, e.g. one source/drain region 174 in column 1 is connected to a source/drain region 174 in column 0, the next region 174 in colum 1 is connected to region 174 in column 2, the next region 174 in column 1 is connected to region 174 in column 0, and so on. Bitline BL1 (column 1) is connected to those regions 174 of column 1 that are connected to column 0; bitline BL2 is connected to those regions 174 in column 1 that are connected to column 2, and so on. Bitlines BL0 and BL5 are each connected to only one column. In some embodiments, these two bitlines are shorted together. As shown in FIG. 10A, the source/drain regions 174 of each column are separated from the source/drain regions 174 in the adjacent columns by field isolation regions 220.

Some of the figures below illustrate vertical cross sections of intermediate structures obtained during the memory fabrication. The sectional planes are indicated in FIG. 10A by lines X1–X1', X2–X2', Y1–Y1', and Y2–Y2'. The line X1–X1' runs in the X direction through floating gates 160 (through an active area 222). The line X2–X2' runs in the X direction between the floating gates (through a trench 220T). The line Y1–Y1' runs in the Y direction through a select gate line 140. The line Y2–Y2' runs in the Y direction through a control gate line 170 and floating gates 160.

In one embodiment, the memory is fabricated as follows. Substrate isolation regions 220 are formed in P doped substrate 120 by shallow trench isolation technology ("STI"). See FIG. 11 (cross section Y1–Y1'). Each region 220 is a dielectric region formed in a trench 220T. Suitable STI processes are described in U.S. Pat. No. 6,355,524 issued Mar. 12, 2002 to Tuan et al.; U.S. patent application Ser. No. 10/262,785 filed Oct. 1, 2002 by Yi Ding; and U.S. patent application Ser. No. 10/266,378 filed Oct. 7, 2002 by C. Hsiao, all incorporated herein by reference. Other STI and non-STI processes are also possible. Dielectric 220 is sometimes called "STI oxide" hereinbelow because it is silicon dioxide in some embodiments. The invention is not limited to such embodiments or to silicon integrated circuits.

Substrate isolation regions are also formed in the memory peripheral area (not shown in FIG. 11). The peripheral area contains circuitry needed to access the memory, and may also contain unrelated circuitry (the memory may be embedded into a larger system).

As shown in FIG. 11, oxide 220 protrudes above the substrate 120. The protruding portions are shown at 220P. An exemplary thickness of portions 220P is 0.12 μm for a 0.18 μm fabrication process (a process with a 0.18 μm minimum line width). The exemplary dimensions given in this section assume a 0.18 μm fabrication process unless mentioned otherwise.

Dopant is implanted into substrate 120 to form an N type region 604 underlying the memory array. Dopant is also implanted into the substrate around the array to form a surrounding N type region (not shown) extending from the top surface of substrate 120 down to region 604. These implants create a fully isolated P well 120W for the memory array. Region 604 is not shown in the subsequent drawings, and the P well 120W is shown simply as substrate 120.

Ion implantation steps ("Vt adjust implants") may be performed into the active areas of substrate 120 to adjust the transistor threshold voltages as needed. One such implant is an N type implant (e.g. arsenic) performed into the array to reduce the threshold voltage of the select gate transistors. This implant creates a counterdoped region 230 at the surface of substrate 120. Region 230 may remain type P, but the net P type dopant concentration in this region is reduced. In some embodiments, region 230 becomes N type in this counterdoping step.

Silicon dioxide 130 (FIG. 12A, cross section Y1–Y1', and FIG. 12B, periphery) is thermally grown on the exposed areas of substrate 120 to provide gate dielectric for the select gates of the memory array and for the peripheral transistors. An exemplary thickness of oxide 130 in the array area is 120 Å. Generally, the oxide thickness depends on the maximum voltage that the oxide 130 is designed to sustain during the memory operation. Oxide 130 can be nitrided when it is being grown, or after it has been grown, to impede boron diffusion from floating gates 160 into substrate 120.

In the example shown in FIG. 12B, the peripheral area includes a high voltage transistor area 512H and a low voltage transistor area 512L. Oxide 130 is grown thermally to a thickness of 60 Å over the entire wafer. This oxide is removed from the low voltage area 512L by a masked etch. The wafer is re-oxidized to re-grow silicon dioxide in area 512L to a thickness of 60 Å. The oxide thickness in the memory array area and in high voltage area 512H increases from 60 Å to 120 Å during this step.

Thus, oxide 130 in the array area and oxide 130 in the high voltage peripheral area 512H is formed simultaneously in these two oxidation steps. All of oxide 130 in area 512L and part of the oxide 130 in the array area and area 512H are formed simultaneously in the second oxidation step.

As shown in FIG. 13A (cross section Y1–Y1') and FIG. 13B (periphery), intrinsic polysilicon layer 140 is formed over the structure by a conformal deposition process (e.g.

low pressure chemical vapor deposition, "LPCVD"). Polysilicon 140 fills the spaces between the oxide protrusions 220P in the memory array area. The top polysilicon surface is planar because the polysilicon portions deposited on the sidewalls of protrusions 220P meet together.

FIG. 13B may represent either the low voltage or the high voltage transistor area. In some embodiments, there are more than two peripheral areas with different gate oxide thicknesses, and FIG. 13I may represent any of these areas.

Polysilicon 140 covers the regions 120i (FIG. 13B) at the interface between substrate 120 and field oxide 220 in the peripheral area. Polysilicon 140 will protect the oxide 220 in this area to prevent formation of grooves ("divots") during subsequent processing. Polysilicon 140 will be used to form the peripheral transistor gates. The grooving in regions 120i under the transistor gates is undesirable because it degrades the transistor characteristics.

Layer 140 can also be formed by non-conformal deposition processes, whether known or to be invented. If the top surface of polysilicon 140 is not planar, it is believed that the polysilicon 140 can be planarized using known techniques (e.g. CMP, or spinning a photoresist layer over the polysilicon 140 and then simultaneously etching the resist and the polysilicon at equal etch rates until all of the photoresist is removed). The bottom surface of polysilicon 140 is non-planar as it goes up and down over the oxide protrusions 220P.

An exemplary final thickness of polysilicon 140 is 0.16 μm over the active areas.

The peripheral area is masked, and polysilicon 140 is doped P+ in the array area. Polysilicon 140 remains undoped ("INTR", i.e. intrinsic) in the periphery. The peripheral transistor gates will be doped later, with the NMOS gates doped N+ and the PMOS gates P+, to fabricate surface channel transistors in the periphery with appropriate threshold voltages. The invention is not limited to the surface channel transistors or any peripheral processing. In particular, entire polysilicon 140 can be doped N+ or P+ after the deposition or in situ.

Silicon dioxide 810 is deposited on polysilicon 140, by CVD (TEOS) or some other process, to an exemplary thickness of 1500 Å. Layer 810 can also be silicon nitride, silicon oxynitride (SiON), or some other material. Layer 810 is sufficiently thick to withstand subsequent oxide etches (and in particular the etch of STI oxide 220 described below in connection with FIG. 20A) and to protect the select gates 140 from counterdoping during subsequent doping steps.

In some embodiments, the top surface of polysilicon 140 and/or oxide 810 is not planar.

The wafer is coated with a photoresist layer 820. See FIG. 14A, cross section X1–X1', and FIG. 14B, periphery. (FIG. 14B shows only the active area, not the field oxide 220.) Resist 820 is patterned to define the select gate lines 140. The peripheral area is covered by the resist. The memory array geometry is not sensitive to a misalignment between mask 820 and the mask defining the isolation trenches 220T (FIGS. 10A, 10B) except possibly at the boundary of the memory array.

Silicon dioxide 810 is etched through the resist openings. The resist is removed, and polysilicon 140 is etched away where exposed by oxide 810. Then the exposed oxide 130 is removed. (In an alternative embodiment, the resist 820 is removed after the etch of polysilicon 140 and/or oxide 130.) The select gate lines are formed as a result. Each select gate 140 will control the conductivity of the underlying portion of the cell's channel region in substrate 120. FIG. 15 is a perspective view of the resulting structure in the array area.

The etch of polysilicon 140 can be a perfectly anisotropic vertical etch. Alternatively, the etch can have a horizontal component to reduce the width Ls (FIG. 14A) of select gate lines 140 (the width Ls is the channel length of the select gate transistor). In one embodiment, a perfectly vertical etch is performed first to remove the exposed portions of layer 140, and then an isotropic etch is performed to reduce the width Ls.

In another embodiment, one or more etching steps are performed as described above to form the lines 140. Then the sidewalls of lines 140 are oxidized. Substrate 120 is also oxidized in this step. The select gate line width Ls is reduced as a result. Then the oxide is removed.

The width Ls can also be reduced by a horizontal etch of layer 810. E.g., if layer 810 is SiON, a dry etch having a horizontal component can be used to pattern this layer.

In another embodiment, the sidewalls of the select gate lines are reacted with some material other than oxygen, with a reaction product forming on the sidewalls. The reaction product is then removed.

The lines 140 can thus be more narrow than the minimal photolithographic line width. The memory packing density is therefore increased.

As shown in FIG. 16 (cross section X1–X1'), the structure is oxidized to grow silicon dioxide 150 on substrate 120 and the sidewall surfaces of polysilicon gates 140 in the array area. Oxide 150 will serve as tunnel oxide on substrate 120, and will provide sidewall insulation for the select gates. The oxide thickness depends on the dopants and dopant concentrations. In some embodiments, oxide 150 is 60 Å to 100 Å thick on substrate 120, and is 300 Å thick on the select gate sidewalls. The peripheral area is covered by oxide 810 (FIG. 13B), and remains substantially unchanged during this step. Oxide 150 can be nitrided to prevent boron diffusion from floating gates 160 into substrate 120 if the floating gates will be doped with boron. In the embodiment being described, the floating gates will be doped P+ to improve the data retention time. (The data retention is improved because the P+ doped polysilicon is a high work function material. See U.S. Pat. No. 6,518,618 issued Feb. 11, 2003 to Fazio et al. and incorporated herein by reference.)

If desired, an additional Vt adjust implant can be performed into the array to adjust the threshold voltage of the floating gate transistors (FG/CG transistors). This implant can be performed either before or after the formation of oxide 150. In one embodiment, the implant is performed after the etch of polysilicon 140 to define the select gates (FIG. 14A) before the removal of oxide 130 from the FG/CG channel areas. The floating gate transistors can be either enhancement or depletion mode transistors.

Floating gate polysilicon 160 (FIG. 17, cross section X1-X1') is deposited over the structure, by LPCVD for example, and is doped P+ during or after the deposition. Polysilicon 160 is sufficiently thick to ensure that its top surface is at least as high throughout the wafer as the top surface of oxide 810. In the embodiment of FIG. 17, the top surface of layer 160 is planar due to a conformal deposition to a thickness larger than half the distance between the adjacent select gate lines 140. In one embodiment, the distance between select gate lines 140 is 0.8 μm, and the polysilicon 160 is more than 0.4 μm thick.

If the top surface of polysilicon 160 is not planar, it is planarized by CMP or a suitable etch.

After planarization (if needed), layer 160 is etched down without a mask. The etch end point is when STI oxide 220 becomes exposed. FIG. 18 (cross section X1–X1') shows an intermediate stage in this etch, when oxide 810 becomes exposed. At this stage, layer 160 has been removed from the periphery, so the periphery becomes as in FIG. 13B. The etch endpoint can be the exposure of oxide 220. The endpoint is well defined if the layer 810 is SiON or silicon nitride, but it is also possible to detect the exposure of oxide 220 if layer 810 is silicon dioxide. Alternatively, the etch can be programmed as a timed etch continuing for a predetermined time after the exposure of layer 810.

FIGS. 19A (cross section X1–X1') and 19B (cross section Y2–Y2') show the array area at the end of the polysilicon etch. The polysilicon has been removed from the top surface of oxide 220. In some embodiments, the final thickness of layer 160 is 1200 Å. The etch is selective to oxide 810.

Optionally, a timed etch of oxide 220 is performed to recess the top surface of oxide 220 below the surface of polysilicon 160. See FIG. 20A (cross section Y2–Y2') and FIG. 20B (perspective view of the array). This etch will improve the capacitive coupling between the floating and control gates. See the aforementioned U.S. Pat. No. 6,355,524. In the embodiment of FIGS. 20A, 20B, the oxide 220 continues to protrude above the top surface of substrate 120 by about 0.10 µm. In other embodiments, the oxide 220 does not protrude above the substrate after the etch (the top surface of layer 220 is level with the top surface of the substrate after the oxide etch).

As mentioned above, layer 810 is sufficiently thick to withstand this etch.

ONO layer 164 (FIG. 21A, cross section X1–X1', and FIG. 21B, periphery) is formed over the structure. Control gate polysilicon layer 170 is deposited on ONO 164 and is doped during or after the deposition. This layer is doped N+ in the embodiment being described, P+ in other embodiments. This may also be a metal or metal silicide layer, or some other conductive material.

The top surface of polysilicon 170 is not planar in the array area. Layer 170 has protrusions 170.1 over the select gate lines 140. Cavities 170C form in layer 170 between protrusions 170.1 over the future positions of bitline regions 174. The protrusions 170.1 will be used to define the overlap between the floating and control gates without additional dependence on photolithographic alignment.

As shown in FIG. 22 (cross section X1–X1'), a layer 1710 is deposited over the structure and etched without a mask to expose the polysilicon 170. Layer 1710 fills the cavities 170C. When layer 1710 is etched in the array area, layer 1710 is removed in the periphery, so the periphery becomes as in FIG. 21lB. In one embodiment, layer 1710 is silicon nitride deposited to have a planar top surface or planarized during the etch.

Polysilicon 170 is etched without a mask. See FIG. 23A (cross section X1–X1') and 23B (periphery). This etch attacks the polysilicon portions 170.1 and exposes ONO 164. Polysilicon layer 170 becomes broken over the select gate lines 140. In other words, the polysilicon etch creates a gap 170G (a through hole) in polysilicon layer 170 over each select gate line 140. In the embodiment of FIG. 23A, the etch endpoint is the exposure of ONO 164. In other embodiments, the etch continues after the exposure of ONO 164. In either case, at the conclusion of the polysilicon etch, polysilicon 170 is exposed near the select gates 140 but some of polysilicon 170 is covered by nitride 1710. The width W1 of the exposed portions of polysilicon layer 170 adjacent to gaps 170G will define the width of the control and floating gates in a self-aligned manner as illustrated below.

In some embodiments, the minimum thickness of polysilicon 170 (near the gaps 170G) is 0.18 µm, and the width W1 is also 0.18 µm.

In the embodiment of FIG. 23A, the etch of polysilicon 170 is selective to nitride 1710. In other embodiments, the etch is not selective to the nitride, and nitride 1710 is etched at the same rate as the polysilicon. The etch can stop on the top oxide sub-layer of ONO 164. The etch can be replaced with CMP. In some embodiments, the etch or the CMP removes some or all of ONO 164 above the select gates 140 and exposes the oxide 810. In either case, at the conclusion of the etch or the CMP process, polysilicon 170 is exposed near the select gates 140 but some of polysilicon 170 is covered by nitride 1710. The width W1 of the exposed polysilicon portions will define the width of the control and floating gates as illustrated below.

A protective layer 1910 (FIG. 24, cross section X1–X1') is formed adjacent to gaps 170G to protect the polysilicon 170 near the select gates 140. In one embodiment, layer 1910 is silicon dioxide formed by thermal oxidation of layer 170. An exemplary thickness of oxide 1910 is 500 Å. Layer 1910 can also be a conductive metal silicide formed selectively on polysilicon 170 by a salicide (self-aligned silicidation) technique. In another embodiment, layer 1910 is deposited over the whole wafer and then removed by CMP from the top surface of layer 1710. See U.S. patent application Ser. No. 10/393,212 filed Mar. 19, 2003 by Yi Ding and incorporated herein by reference.

Nitride 1710 is removed (by a wet etch for example) selectively to oxide 1910. The resulting structure is shown in FIG. 25 (cross section X1–X1'). The periphery remains as in FIG. 23B.

Polysilicon 170, ONO 164, and polysilicon 160 are etched with oxide 1910 as a mask. The resulting structure is shown in FIG. 26A (cross section X1–X1') and FIG. 26B (periphery). In some embodiments, the polysilicon etch of layers 170, 160 is anisotropic, and the etch of ONO 164 is isotropic or anisotropic. The ONO etch may remove the ONO 164 over the select gates 140 and may also remove portions of oxide 1910 and/or oxide 810.

In each FG/CG stack, the floating gate 160 together with control gate 170 control the underlying portion of the cell's channel region.

A photoresist layer (not shown) is formed over the wafer and patterned to cover the array but expose the entire periphery. Then oxide 810 (FIG. 26B) is etched away from the peripheral area.

The resist covering the array is removed, and another photoresist layer (not shown) is formed to cover the array and define the peripheral transistor gates. Polysilicon 140 is etched away where exposed by this resist.

The resist is removed. The wafer is coated with a photoresist layer 2720 (FIG. 27B, periphery). The resist is patterned to expose the entire array area (FIG. 27A, cross section X1–X1') and also to expose the peripheral NMOS transistor regions. FIG. 27B shows a peripheral NMOS transistor region 512N with a P well 2724P, and a peripheral PMOS transistor region 512P with an N well 2724N. These wells were defined before formation of oxide 130. There can be many regions 512N, 512P in the integrated circuit. Resist 2720 covers the PMOS transistor regions 512P. An N type implant (N−) is performed to form the LDD (lightly doped drain) extensions for peripheral NMOS source/drain regions 2730N (FIG. 27B). This implant also dopes the NMOS gates 140 in the periphery. In addition, the implant dopes bitline regions 174 (FIG. 27A).

In some embodiments, the memory array is not exposed by resist 2720, and no doping is performed in the bitline regions at this step.

Resist 2720 is removed, and another photoresist layer 2820 (FIG. 28, periphery) is formed to cover the NMOS peripheral transistor regions 512N and the memory array. A P type implant (P−) is performed to form the LDD extensions for PMOS source/drain regions 2730P and to dope the peripheral PMOS transistor gates.

Resist 2820 is removed. A thin silicon dioxide layer 2904 (see FIG. 29A, cross section X1–X1', and FIG. 29B, periphery) is grown on the exposed silicon surfaces of layers 140, 160, 170 by a rapid thermal oxidation process (RTO). Alternative techniques can also be used such as chemical vapor deposition (e.g. TEOS CVD), a high temperature oxide process (HTO), or other suitable techniques, known or to be invented. These techniques may form the oxide 2904 over the entire structure and not only on the silicon surfaces. An exemplary thickness of oxide 2904 is 100 Å.

A silicon nitride layer 2910 is deposited to an exemplary thickness of 500 Å to 800 Å. Layer 2910 is etched anisotropically without a mask to form sidewall spacers over the gate structures. The etch of nitride 2910 may remove some of oxide 810 in the array area (FIG. 29A). If oxide 2904 was deposited over the entire structure (by TEOS CVD or HTO for example), oxide 2904 will help protect the substrate 120 during the nitride etch.

Then N+ and P+ implants are performed to create source/drain structures for the peripheral transistors and the bitline regions 174. More particularly, the peripheral PMOS transistor area 512P is masked with resist (not shown), and an N+ implant is performed to create the source/drain structures for bitline regions 174 and the peripheral NMOS transistors and increase the dopant concentration in the peripheral NMOS gates 140. The floating, control and select gates and the overlying layers mask this implant so no additional masking in the array area is needed.

The resist is removed. The array and the peripheral NMOS transistor regions 512N are masked with a resist (not shown), and a P+ implant is performed to create the source/drain structures for the peripheral PMOS transistors and increase the dopant concentration in the PMOS transistor gates 140.

The resist is removed. A silicon dioxide etch is performed to remove the oxide 1910 and expose the control gate lines 170 (FIG. 30A, cross section X1–X1'). This etch also removes the exposed portions of oxide 150 over bitline regions 174 in the array area, the exposed oxide 130 over source/drain regions 2730N, 2730P in the periphery (see FIG. 30B), and the oxide 2904 over the peripheral transistor gates.

A conductive metal silicide layer 2920 is formed by a self-aligned silicidation (salicide) process on the exposed silicon surfaces of control gate lines 170, bitline regions 174, peripheral transistor gates 140 and peripheral source/drain regions 2730N, 2730P. The salicide process involves depositing a metal layer, heating the structure to react the metal with the silicon, and removing the unreacted metal. This can be followed by an anneal or any other suitable processing, known or to be invented, to improve the silicide properties (e.g. increase its conductivity). Titanium, cobalt, nickel, and other conductive materials, known or to be invented, can be used for the metal layer. Non-salicide selective deposition techniques, known or to be invented, that selectively for a conductive layer 2920 on the exposed silicon but not on a non-silicon surface, can also be used. Silicide 2920 has a lower resistivity and a lower sheet resistance than polysilicon 170.

As noted above in connection with FIG. 24, layer 1910 can be a conductive metal silicide formed by a salicide process. In this case, layer 1910 does not have to be removed. The silicidation process of FIG. 30A will silicide the bitline regions 174, the peripheral gates 140 and the peripheral source/drain regions 2730.

As shown in FIG. 31A (cross section X1–X1'), FIG. 31B (array boundary or an array gap without floating gates), and FIGS. 31C and 31D (periphery), inter-level dielectric 3204 is deposited over the wafer. FIG. 31C shows only an NMOS transistor region, but the PMOS regions are similar. Contact openings are etched in dielectric 3204 to expose the silicided surfaces of bitline regions 174 (FIG. 31A), control gates 170 (FIG. 31B), peripheral source/drain regions 2730N and 2730P (FIGS. 30B, 31C), and peripheral gates 140 (FIG. 31D). The silicide 2920 protects the bitline regions 174 and the source/drain regions 2730 during this etch. A conductive layer 3210 (e.g. metal) is deposited and patterned to contact the silicided regions. The figures also show an optional metal layer 3220 (e.g. tungsten) used to fill the contact openings before the deposition of layer 3210.

Figure 9:
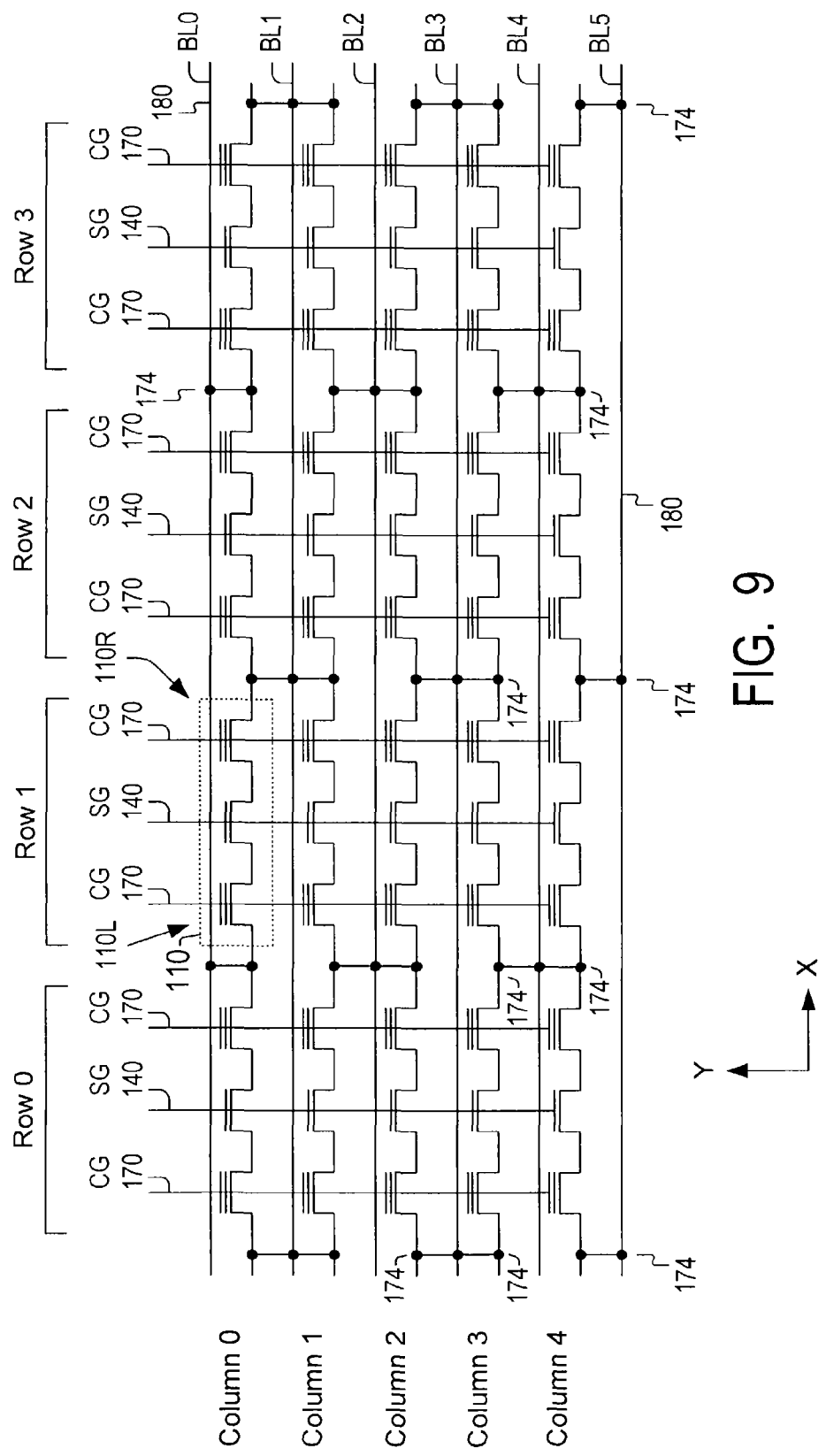
FIG. 9 is a circuit diagram of a memory array according to an embodiment of the present invention.
Figure 10A:
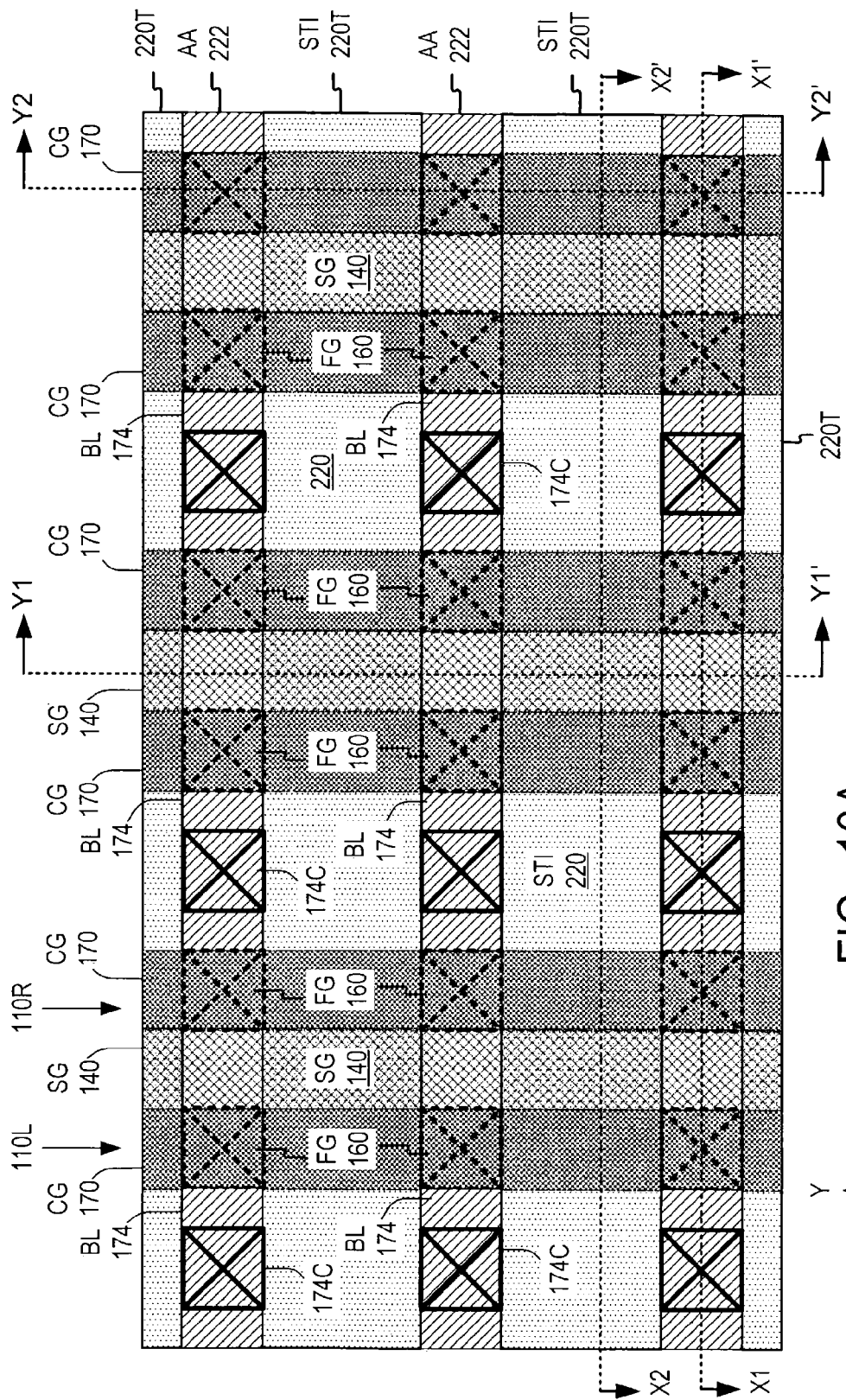
FIG. 10A is a top view of a memory array according to an embodiment of the present invention.
Figure 10B:
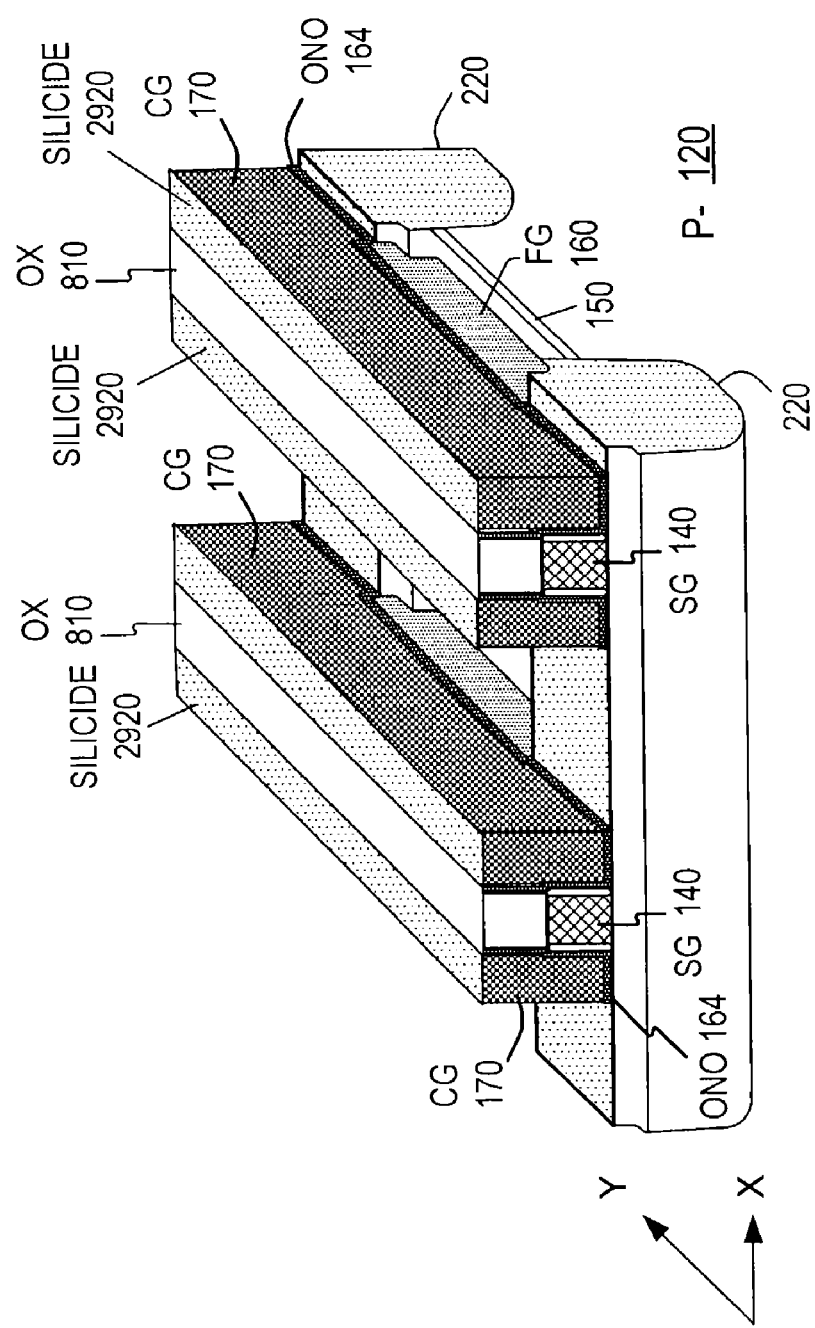
FIG. 10B is a perspective view showing some features of the memory of FIG. 10A.

In the embodiment of FIG. 31A, metal 3210 is used to form jumpers between the adjacent bitline regions 174 connected together (see FIG. 9). Then another dielectric layer 3230 (not shown in FIGS. 31B–31D) is deposited, contact openings are etched in this layer to jumpers 3210, and another metal layer 3240 is deposited on top and patterned to form the bitlines 180. The bitlines contact the bitline regions 174 through the jumpers made from metal 3210. The openings in layer 3240 are filled with optional tungsten plugs 3250 before the metal 3240 is deposited.

FIG. 31E (top view) shows an extension of a peripheral transistor gate 140 over STI oxide 220. The extension can be made to form a contact to the gate or for some other reason (e.g. to connect the gate to other features). The region 120i at the interface between the substrate 120 and field oxide 220 is protected from the divot formation because the gate is formed using the first polysilicon layer 140. See also FIG. 13B. The transistor of FIG. 31E can be a high voltage transistor (in area 512H in FIG. 12B) or a low voltage transistor (in area 512L).

In FIG. 30A, the width of select gate 140 is shown as Ls, and the width of each of floating gates 160 is shown as Lf. The floating gate width Lf is defined by the parameter W1 (FIG. 23A) in a self-aligned manner, so Lf can be smaller than the minimal photolithographic line width. Ls can also be smaller than the minimal photolithographic line width as explained above in connection with FIG. 14A. Ls can be smaller than Lf, or can be equal to or larger than Lf.

In each bit of the memory cell, ONO layer 164 forms a continuous feature overlying the respective floating gate and overlaying a sidewall of select gate line 140. This feature extends the whole length of the select gate line 140 (in the Y direction). Control gate 170 overlies the continuous feature of ONO 164. The portion of ONO 164 overlaying the sidewall of select gate line 140 separates the control gate 170 from the select gate 140.

Other details of the memory fabrication process for one embodiment are given in U.S. patent application Ser. No. 10/393,212 "NONVOLATILE MEMORIES AND METHODS OF FABRICATION" filed Mar. 19, 2003 by Yi Ding and incorporated herein by reference.

Figure 32:
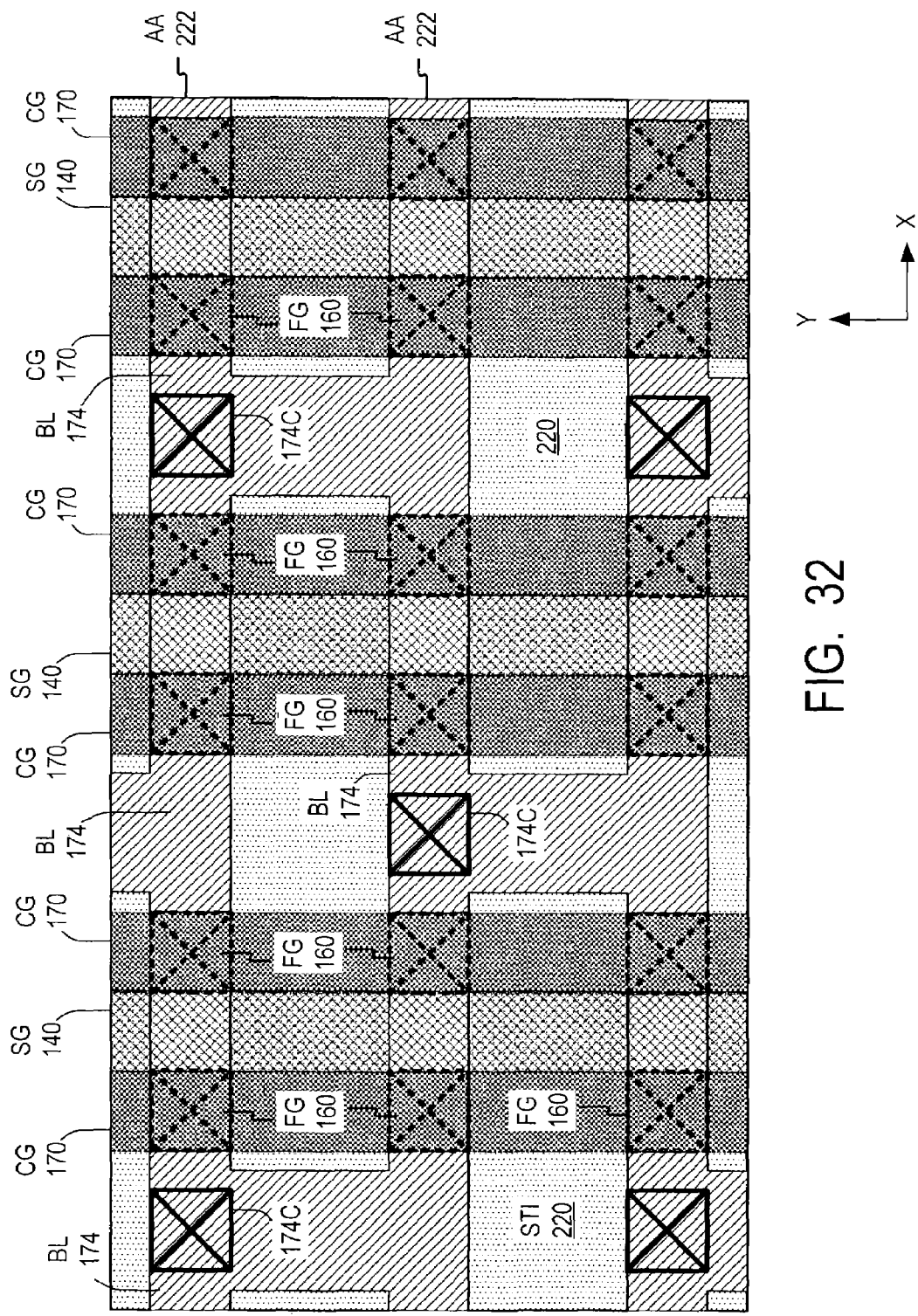

FIG. 32 shows an alternative layout of the array. Here the connection between the source/drain regions 174 in the adjacent columns is done through the substrate 120. Each contiguous N+ type region 174 provides two source/drain regions for one of the two adjacent columns and also provides two source/drain regions 174 for the other one of the adjacent columns. In the first and last rows of the array, each region 174 provides one source/drain region for each of the two adjacent columns. Jumpers made from layer 3210 of FIG. 31A are unnecessary. Layer 3210 can be used to form the bitlines 180. The number of bitline contact openings 174C can be reduced, because only one contact is needed for each pair of source/drain regions 174 that are shorted together. Other layouts are also possible.

Figure 5:
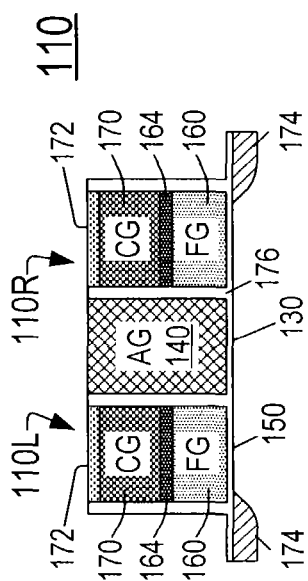
Figure 1:
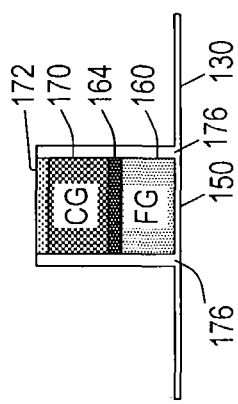
Figure 4:
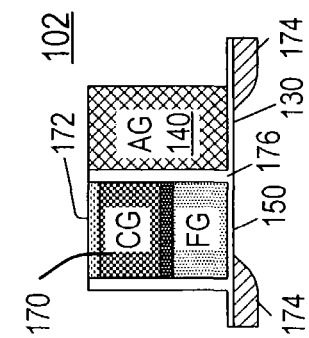
Figure 7:
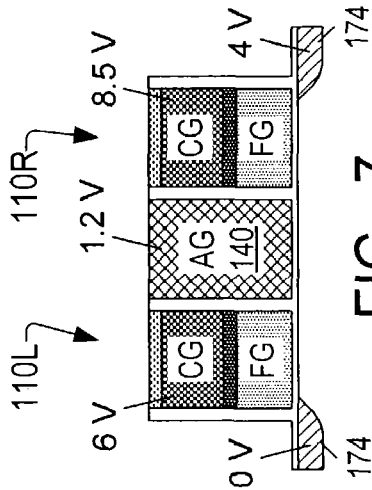
Figure 6:
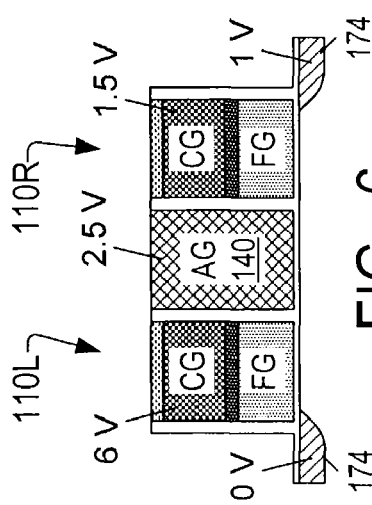
Figure 8:
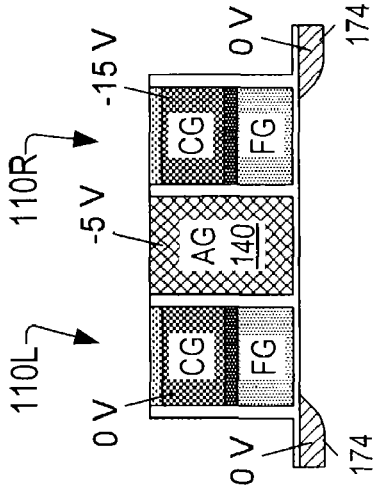

In some embodiments, the memory cells are read, programmed and erased using the same voltages and mechanisms as the cell of FIG. 5. The programming is done by channel hot electro ejection (CHIE) or Fowler-Nordheim tunneling. The voltages can be as in FIGS. 6–8. Other exemplary voltages are shown in the following Table 1:

TABLE 1

|  | Read | Program (CHEI) | Erase |
| --- | --- | --- | --- |
| Select gate 140 |  |  |  |
| Selected row: | 2.5 V | 1.5 V | 2 V |
| Unselected row: | 0 V | 0 V | 0 V |
| Control gate 170 |  |  |  |
| Selected row: |  |  |  |
| Selected bit (Left or Right): | 1.5 V to 2 V | 9 V to 10 V | −9 V to −10 V |
| Unselected bit: | 7 V to 7.5 V | 7 V to 7.5 V | 0 V |
| Unselected row: | 0 V | 0 V | 0 V |
| Bitline 180 |  |  |  |
| Selected column: |  |  |  |
| Selected bit: | 1.5 V | 4.5 V to 5 V | Floating |
| Unselected bit: | 0 V | 0 V | 0 V |
| Unselected column: | 0 V | 0 V | 0 V |
| Substrate 120: | 0 V | 0 V | 7 V to 8 V |

The erase operation is through the channel region in substrate 120 (bulk erase). In other embodiments, the memory is erased through a source/drain region 174. The programming can be performed by Fowler-Nordheim tunneling. In some embodiments, the programming is performed by an electron transfer between floating gate 160 and select gate 140.

The invention is not limited to any particular read, erase or programming techniques, or to particular voltages. For example, the memory can be powered by multiple power supply voltages. Floating gates 160 can be defined using a masked etch, and can extend over sidewalls of select gate lines 140. See U.S. patent application Ser. No. 10/411,813 filed by Yi Ding on Apr. 10, 2003 and incorporated herein by reference. Select gates 140 and/or floating gates 160 may be doped N+, and/or may include non-semiconductor materials (e.g. metal silicide). The invention is not limited to the arrays of FIG. 9. Also, substrate isolation regions 220 do not have to traverse the entire array. The invention is applicable to non-flash memories (e.g. non-flash EEPROMs) and to multi-level memory cells (such a cell can store multiple bits of information in each floating gate). Other embodiments and variations are within the scope of the invention, as defined by the appended claims.

The invention claimed is:

1. A method for fabricating an integrated circuit comprising a nonvolatile memory comprising a nonvolatile memory cell comprising two floating gates, a select gate, and two control gates, the nonvolatile memory further comprising a first peripheral transistor, the method comprising:

(a) forming a dielectric layer on a semiconductor substrate, the dielectric layer comprising a first dielectric region ("select gate dielectric") and a second dielectric region ("first peripheral transistor gate dielectric"), wherein the select gate dielectric and the first peripheral transistor gate dielectric are formed simultaneously;

(b) forming a first layer over the dielectric layer and patterning the first layer to provide (i) the select gate on the select gate dielectric, and (ii) a gate for the first peripheral transistor on the first peripheral transistor gate dielectric;

(c) forming the first layer, forming one or more second layers which provide the floating gates and the control gates for the memory cell.

2. The method of claim 1 wherein the memory cell comprises a continuous channel region of a first conductivity type in the semiconductor substrate, the select gate controls a conductivity of a portion of the channel region, and each of the floating gates overlies a respective other portion of the channel region.

3. The method of claim 2 wherein the control gates overlie the respective floating gates.

4. The method of claim 1 wherein the one or more second layers are a plurality of layers.

5. The method of claim 1 wherein the select gate dielectric and the first peripheral transistor gate dielectric are formed by oxidation of the semiconductor substrate.

6. The method of claim 5 wherein the select gate dielectric and the first peripheral transistor gate dielectric comprise silicon oxide.

7. The method of claim 1 further comprising, after forming the first layer, forming a dielectric ("floating gate dielectric") on the semiconductor substrate to separate the floating gates from the substrate, wherein the floating gate dielectric is formed of the same material as the select gate dielectric but is thinner than the select gate dielectric.

8. The method of claim 1 further comprising forming a second peripheral transistor gate dielectric on the semiconductor substrate for a second peripheral transistor, and forming a gate of the second peripheral transistor on the second peripheral transistor gate dielectric, wherein the second peripheral transistor gate dielectric is made from the same material as the select gate dielectric and the first peripheral transistor gate dielectric but the thickness of the second peripheral transistor gate dielectric is different from the thickness of the first peripheral transistor gate dielectric.

9. The method of claim 8 wherein the second peripheral transistor gate dielectric is thinner than the first peripheral transistor gate dielectric.

10. The method of claim 8 wherein the select gate dielectric as at least as thick as a gate dielectric of any peripheral transistor in said memory.

11. The method of claim 8 wherein the second peripheral transistor gate dielectric is formed after the start of the operation (a).

12. The method of claim 8 wherein the second peripheral transistor gate dielectric is formed before the operation (b).

13. The method of claim 8 wherein the gate of the second peripheral transistor is formed by patterning the first layer in the operation (b).

14. The method of claim 1 wherein the memory cell is one of a plurality of nonvolatile memory cells of said memory, each memory cell comprising two floating gates, a select gate, and two control gates, wherein:

the operation (a) simultaneously forms select gate dielectric for each of the memory cells; and the operation (b) simultaneously forms the select gate for each of the memory cells on the corresponding select gate dielectric.

15. The method of claim 1 wherein during a memory cell writing operation, the first peripheral transistor is exposed to a voltage of a higher magnitude than any voltage provided to the memory cell in a reading operation.

16. The method of claim 15 wherein during the memory cell writing operation, the first peripheral transistor is exposed to a voltage of a higher magnitude than any power supply voltage provided to the nonvolatile memory.

17. The method of claim 1 wherein the memory is to support a writing operation in which the memory cell is written by a transfer of a charge between one of the floating gates and a channel region of the memory cell, the channel region being located in the semiconductor substrate.

18. The method of claim 1 wherein the operation (c) further comprises patterning the one or more second layers to provide the floating and control gates.

19. The method of claim 1 wherein the first layer patterning comprises:
   (b1) patterning the first layer to provide the select gate; and
   (b2) patterning the first layer to provide the gate for the first peripheral transistor;
   wherein the operation (c) is performed after the operation (b1) but before the operation (b2).

20. The method of claim 1 further comprising, after forming the first layer but before forming the one or more second layers, forming a dielectric ("floating gate dielectric") on the semiconductor substrate to separate the floating gates from the substrate.

21. The method of claim 20 wherein the first layer patterning comprises:
   (b1) patterning the first layer to provide the select gate; and
   (b2) patterning the first layer to provide the gate for the first peripheral transistor;
   wherein the floating gate dielectric is formed after the operation (b1).

22. The method of claim 1 wherein the memory cell comprises a continuous channel region of a first conductivity type in the semiconductor substrate, and each of the floating gates controls a conductivity of a respective portion of the channel region.

23. The method of claim 22 wherein the select gate controls the conductivity of a portion of the channel region.

24. The method of claim 23 wherein the channel's portion whose conductivity is controlled by the select gate is between the channel's portions whose conductivities are controlled by the floating gates.

25. The method of claim 1 wherein the memory cell comprises two source/drain regions and a continuous channel region bordering on the source/drain regions, wherein the channel region has an opposite conductivity type from the source/drain regions, and each floating gate of the memory cell overlies a portion of the channel region.

26. The method of claim 1 wherein the floating gates are adjacent to respective two opposite sidewalls of the select gate and are insulated from the select gate.

* * * * *

UNITED STATES PATENT AND TRADEMARK OFFICE
CERTIFICATE OF CORRECTION

PATENT NO. : 7,052,947 B2  Page 1 of 1
APPLICATION NO. : 10/632154
DATED : May 30, 2006
INVENTOR(S) : Yi Ding It is certified that error appears in the above-identified patent and that said Letters Patent is hereby corrected as shown below:

On Title page, item 73 please delete Assignee country "JP" and insert --TW--

Col. 12, line 9 after "(c)" insert --after--

Col. 12, line 11 after "memory cell" insert --, the floating and control gates being provided entirely by the one or more second layers, the floating and control gates comprising no protion of the first layer--

Signed and Sealed this

Eleventh Day of March, 2008

JON W. DUDAS
*Director of the United States Patent and Trademark Office*